(12) United States Patent
Yang et al.

(10) Patent No.: US 11,710,700 B2
(45) Date of Patent: Jul. 25, 2023

(54) GRAPHENE-ASSISTED LOW-RESISTANCE INTERCONNECT STRUCTURES AND METHODS OF FORMATION THEREOF

(71) Applicant: Taiwan Semiconductor Manufacturing Co., Ltd., Hsin-Chu (TW)

(72) Inventors: Shin-Yi Yang, New Taipei (TW); Yu-Chen Chan, Taichung (TW); Ming-Han Lee, Taipei (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 17/391,216

(22) Filed: Aug. 2, 2021

(65) Prior Publication Data
US 2022/0020694 A1 Jan. 20, 2022

Related U.S. Application Data

(63) Continuation of application No. 16/573,817, filed on Sep. 17, 2019, now Pat. No. 11,081,447.

(51) Int. Cl.
*H01L 23/532* (2006.01)
*H01L 21/768* (2006.01)
*H01L 23/522* (2006.01)

(52) U.S. Cl.
CPC .. *H01L 23/53276* (2013.01); *H01L 21/76802* (2013.01); *H01L 21/76805* (2013.01); *H01L 21/76829* (2013.01); *H01L 21/76834* (2013.01); *H01L 21/76849* (2013.01); *H01L 21/76877* (2013.01); *H01L 23/5226* (2013.01); *H01L 23/53295* (2013.01)

(58) Field of Classification Search
CPC ......... H01L 21/76802; H01L 21/76805; H01L 21/76829; H01L 21/76834; H01L 21/76849; H01L 23/481; H01L 23/5226; H01L 23/53204; H01L 23/53276; H01L 23/53295; H01L 23/538
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,987,922 B2 | 3/2015 | Yu et al. |
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

*Primary Examiner* — Cheung Lee
(74) *Attorney, Agent, or Firm* — Haynes and Boone, LLP

(57) ABSTRACT

A semiconductor structure is provided. The semiconductor structure comprises a first conductive feature embedded within a first dielectric layer, a via disposed over the first conductive feature, a second conductive feature disposed over the via, and a graphene layer disposed over at least a portion of the first conductive feature. The via electrically couples the first conductive feature to the second conductive feature.

20 Claims, 26 Drawing Sheets

(56) References Cited

U.S. PATENT DOCUMENTS

| | | |
|---|---|---|
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0284802 A1* | 9/2014 | Sakata .............. H01L 23/53257 257/750 |

\* cited by examiner

GRAPHENE-ASSISTED LOW-RESISTANCE INTERCONNECT STRUCTURES AND METHODS OF FORMATION THEREOF

CROSS-REFERENCE TO RELATED APPLICATIONS

This is a continuation of U.S. Non-Provisional patent application Ser. No. 16/573,817, filed on Sep. 17, 2019 and entitled "Graphene-assisted Low-resistance Interconnect Structures and Methods of Formation Thereof," the entire disclosure of which is incorporated herein by reference.

BACKGROUND

The integrated circuit (IC) industry has experienced exponential growth. Technological advances in IC materials and designs have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, it is understood that inadvertent misalignments between conductive features at different levels of an interconnect structure, such as a via feature and a metal line feature, may lead to a reduced contact area and an increased contact resistance. Such an increase in resistance is particularly problematic for smaller technology nodes as it may negate any improvement in performance due to the reduced node size. Additionally, misalignments present increased risk of forming short circuits between uninsulated pair of conductive features that is not intended, causing device reliability concerns. Since misalignments are difficult to eliminate, there remains a need to improve upon the existing interconnect technologies to address these issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
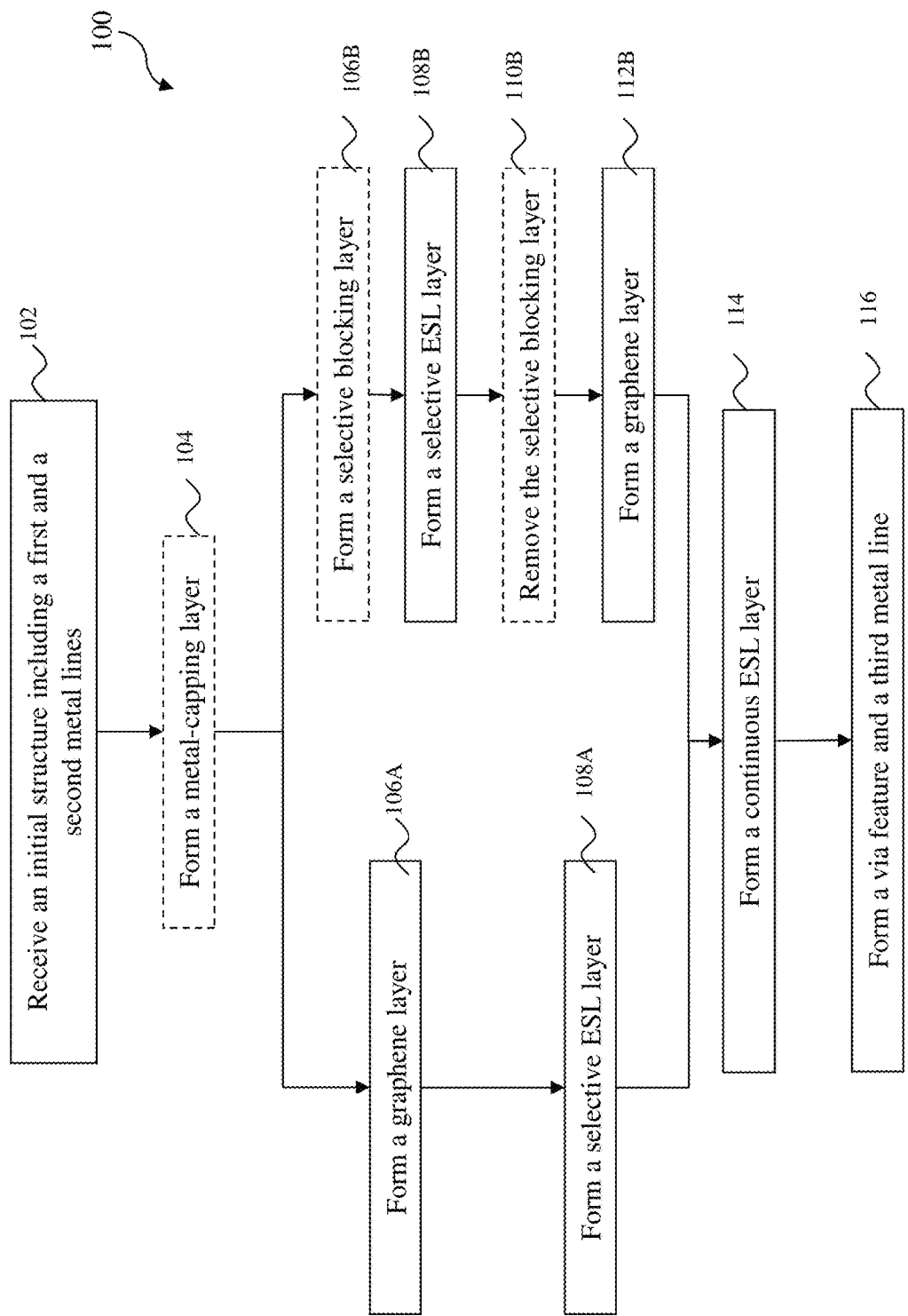
FIG. 1 is a flow chart of a method for fabricating an interconnect structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As described above, there remains a need to address the challenges presented by inadvertent misalignments between the various components of an interconnect structure, particularly as technology node shrinks. For example, it is desirable to reduce the contact resistance between a via and a conductive feature beneath the via when misalignment occurs. It is also desirable to minimize the risk of forming a short circuit between the via and a neighboring conductive feature in the event of misalignment. According to principles described herein, a graphene layer is formed over a conductive feature of the interconnect structure. In some embodiments, the presence of the graphene layer reduces the contact resistance between the conductive feature and a subsequently formed via above the conductive feature. In other embodiments, the presence of the graphene layer assists the formation of a selective etching-stop layer (ESL) between conductive features which ensures proper insulation between them even when a coupled via is placed close to the conductive neighbors. As a result, the device reliability is improved.

FIG. 1 illustrates a flowchart of method 100 for fabricating one or more semiconductor devices in accordance with some embodiments of the invention. The method 100 is discussed in detail below, with reference to an initial structure 205 of a semiconductor device 200 shown in FIGS. 2A and 2B. FIGS. 3A-3E, 4A-4F, and 6A-6J illustrate fragmentary cross-sectional views of the semiconductor device 200 during various fabrication stages and constructed according to various aspects of the present disclosure in one or more embodiments. FIG. 5 illustrates a flowchart of a method for forming a graphene layer as part of the interconnect structure according to some embodiments of the invention.

Figure 2A:
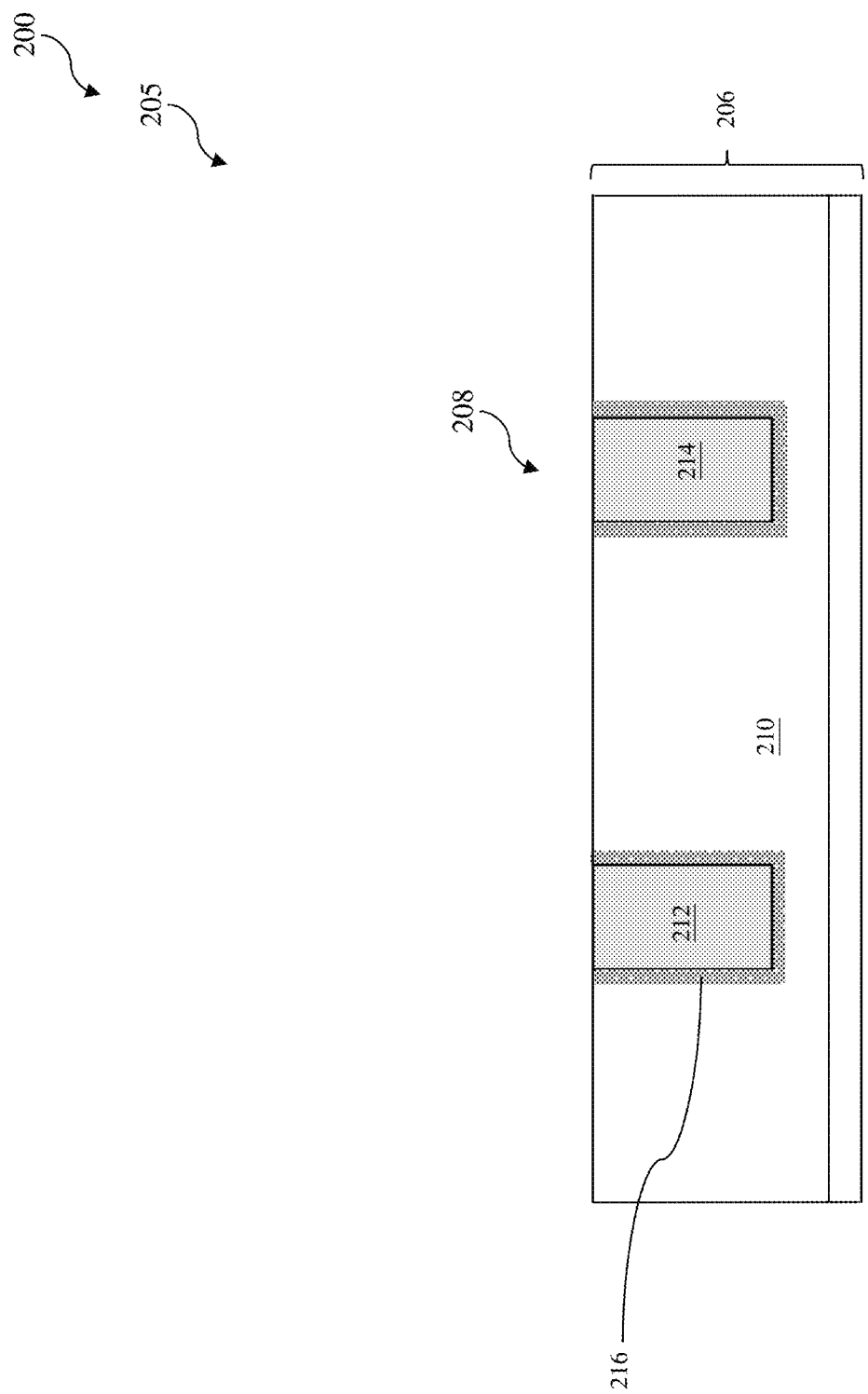
FIGS. 2A-2B, 3A-3E, 4A-4G, 6A-6J are fragmentary cross-sectional views of an interconnect structure of a semiconductor device at various stages of fabrication according to various aspects of the present disclosure.

Referring to block 102 of FIG. 1 and FIG. 2A, the method 100 starts by providing an initial structure 205. The initial structure 205 includes a substrate 206, which may include silicon. Alternatively or additionally, the substrate 206 may include other elementary semiconductors such as germanium. The substrate 206 may also include a compound semiconductor such as silicon carbide, gallium arsenic, indium arsenide, and indium phosphide. The substrate 206 may include an alloy semiconductor such as silicon germanium, silicon germanium carbide, gallium arsenic phosphide, and gallium indium phosphide. In one embodiment, the substrate 206 includes an epitaxial layer. For example, the substrate may have an epitaxial layer overlying a bulk semiconductor. Furthermore, the substrate 206 may include a semiconductor-on-insulator (SOI) structure. For example, the substrate 206 may include a buried oxide (BOX) layer formed by a process such as separation by implanted oxygen (SIMOX) or other suitable technique, such as wafer bonding and grinding.

The substrate 206 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 206 may further include other functional features such as a resistor or a capacitor formed in and on the substrate. The substrate 206 may further include lateral isolation features provided to separate various devices formed in the substrate 206. In one embodiment, shallow trench isolation (STI) features are used for lateral isolation. The various IC devices may further include other features, such as silicide disposed on S/D and gate stacks overlying channels.

The substrate 206 may also include a plurality of dielectric layers and conductive features integrated to form an interconnect structure configured to couple the various p-type and n-type doped regions and the other functional features (such as gate electrodes), resulting in a functional integrated circuit. In one example, the substrate 206 may include a portion of the interconnect structure. The interconnect structure includes a multi-layer interconnect (MLI) structure (208) and an inter-level dielectric (ILD) (210) integrated with the MLI structure, providing an electrical routing to couple various devices in the substrate 206 to the input/output power and signals. The interconnect structure includes various conductive features, such as metal lines, contacts and via features (or via plugs). The metal lines provide horizontal electrical routing. The contacts provide vertical connection between silicon substrate and metal lines while via features provide vertical connection between metal lines in different metal layers.

Exemplary MLI structure 208 includes conductive features 212 and 214 as shown in FIG. 2A for illustration. In one embodiment, the conductive features 212 and 214 include a portion of the interconnect structure. For example, the conductive feature 214 includes a contact, a metal via, or a metal line. The conductive feature 214 may include copper (Cu), cobalt (Co), nickel (Ni), ruthenium (Ru), iridium (Jr), platinum (Pt), rhodium (Rh), iron (Fe), aluminum (Al), copper (Cu), tungsten (W), or bimetallic combinations thereof, such as FeCo and FeAl. In another embodiment, the conductive feature 214 includes an electrode of a capacitor, a resistor or a portion of a resistor. Alternatively, the conductive feature 214 includes a doped region (such as a source or a drain), or a gate electrode. In another example, the conductive feature 214 are silicide features disposed on respective source, drain or gate electrode. The silicide feature may be formed by a self-aligned silicide (salicide) technique. The conductive feature 212 may include the same or different components than the conductive feature 214, and may be of the same or different materials than the conductive feature 214.

In some embodiments, the conductive features 212 and 214 may be further surrounded by a barrier layer 216 to prevent diffusion and/or provide material adhesion. The barrier layer 216 may include titanium nitride (TiN), tantalum nitride (TaN), tungsten nitride (WN), titanium silicon nitride (TiSiN), and/or tantalum silicon nitride (TaSiN). The conductive features 212 and 214 and the barrier layer 216 may be formed by a procedure including lithography, etching and deposition. An example lithography process may include coating, exposure, post exposure baking, and developing processes. The etching process may include a wet etching, a dry etching, and/or a combination thereof. The deposition technique may include physical vapor deposition (PVD), chemical vapor deposition (CVD), metal-organic chemical vapor deposition (MOCVD), atomic layer deposition (ALD), and/or other suitable technique.

PVD is a process by which a material is put into a vapor, and then deposited from that vapor onto a substrate. An ALD process involves sequentially and alternatingly applying different materials to form a thin film layer on a substrate positioned within a deposition chamber. Particularly, the ALD process involves a number of cycles. Each cycle involves a deposition process and a purge process. The deposition processes for a set of cycles alternate between different types of materials being deposited. The purge process for each of the cycles is used to remove material from the deposition chamber before the subsequent cycle is performed. One type of ALD process is a PEALD process. For a PEALD process, each cycle includes a plasma treatment process followed by a post-plasma purge process. The plasma treatment process provides a number of benefits to improve the quality of the ALD process. A CVD process involves exposing the substrate to a volatile precursor, which reacts or decomposes on the substrate to produce the desired deposit. One type of CVD process is a PECVD process. A PECVD process uses plasma to enhance the rate of deposition. This allows the process to be performed at lower temperatures.

Figure 2B:
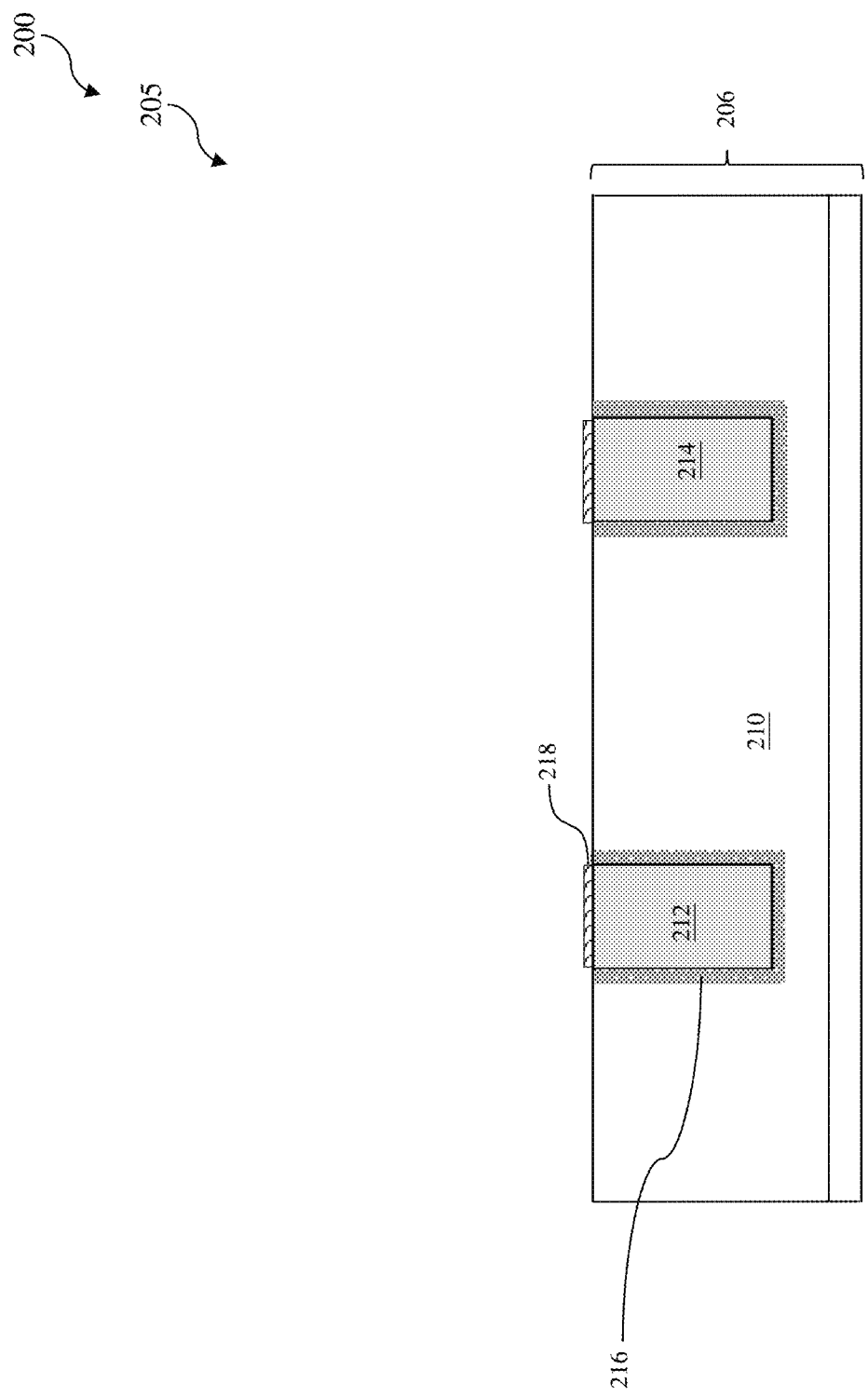

Turning to the block 104 of FIG. 1 and FIG. 2B, the method 100 optionally includes forming a selective metal capping layer 218 over the conductive features 212 and 214. The selective metal capping layer 218 may include any appropriate metals, such as Ni, Co, Fe, Cu, or combinations thereof. In many embodiments, the selective metal capping layer 218 includes a metal that is catalytically active to facilitate the formation of the graphene layers 220 over the selective metal capping layer 218 (discussed below in more details with reference to FIGS. 3A and 5). The thickness of the selective metal capping layer 218 may be between about 5 Å and about 100 Å. The selective metal capping layer 218 is deposited over the conductive features 212 and 214 by any appropriate methods, such as ALD, CVD, PEALD, PECVD, or combinations thereof. In many embodiments, the selective metal capping layer 218 selectively deposits over the conductive features 212 and 214 due to metal-to-metal interactions, while leaving the remaining portions of the substrate surface substantially free from its coverage. Accordingly, the selective metal capping layer 218 includes a plurality of segments. The deposition may be conducted at a temperature between about 100° C. and about 400° C. and at a pressure between about 0.5 torr and about 10 torr, and may utilize hydrogen or ammonia as the reactant gas.

Once the initial structure 205 is received, the method 100 proceeds to form a graphene layer and a selective ESL over the initial structure 205. The graphene layer overlays the conductive features 212 and 214 while the selective ESL overlays the remaining portions of the surface. As shown in FIG. 1, at this stage, the method 100 may proceed via one of at least two implementations. In one implementation, the method proceeds through blocks 106A and 108A, and continues through blocks 114 and 116. In another implementation, the method proceeds through blocks 106B to 112B, and also continues through blocks 114 and 116.

FIGS. 3A-3E illustrate the first implementation of the method 100. Turning to the block 106A of FIG. 1 and FIG. 3A, the method 100 includes forming a graphene layer 220 over the selective metal capping layer 218, or when the selective metal capping layer 218 is not formed, over the conductive features 212 and 214. Graphene is an allotrope of carbon. It includes a layer of carbon atoms that are arranged in a hexagonal lattice. Graphene has a variety of desirable properties. One desirable property is that graphene has a high conductance and low resistance. Thus, the presence of the graphene layer 220 reduces the contact resistance between the metal capping layer 218 (or the conductive feature 214) with any subsequently formed conductive features over the graphene layer 220, such as a subsequently formed metal via feature. In an embodiment, the thickness of the graphene layer is between about 5 Å and about 300 Å. In another embodiment, the graphene layer 220 may include anywhere between 1 and about 10 layers of carbon atoms.

Figure 3A:
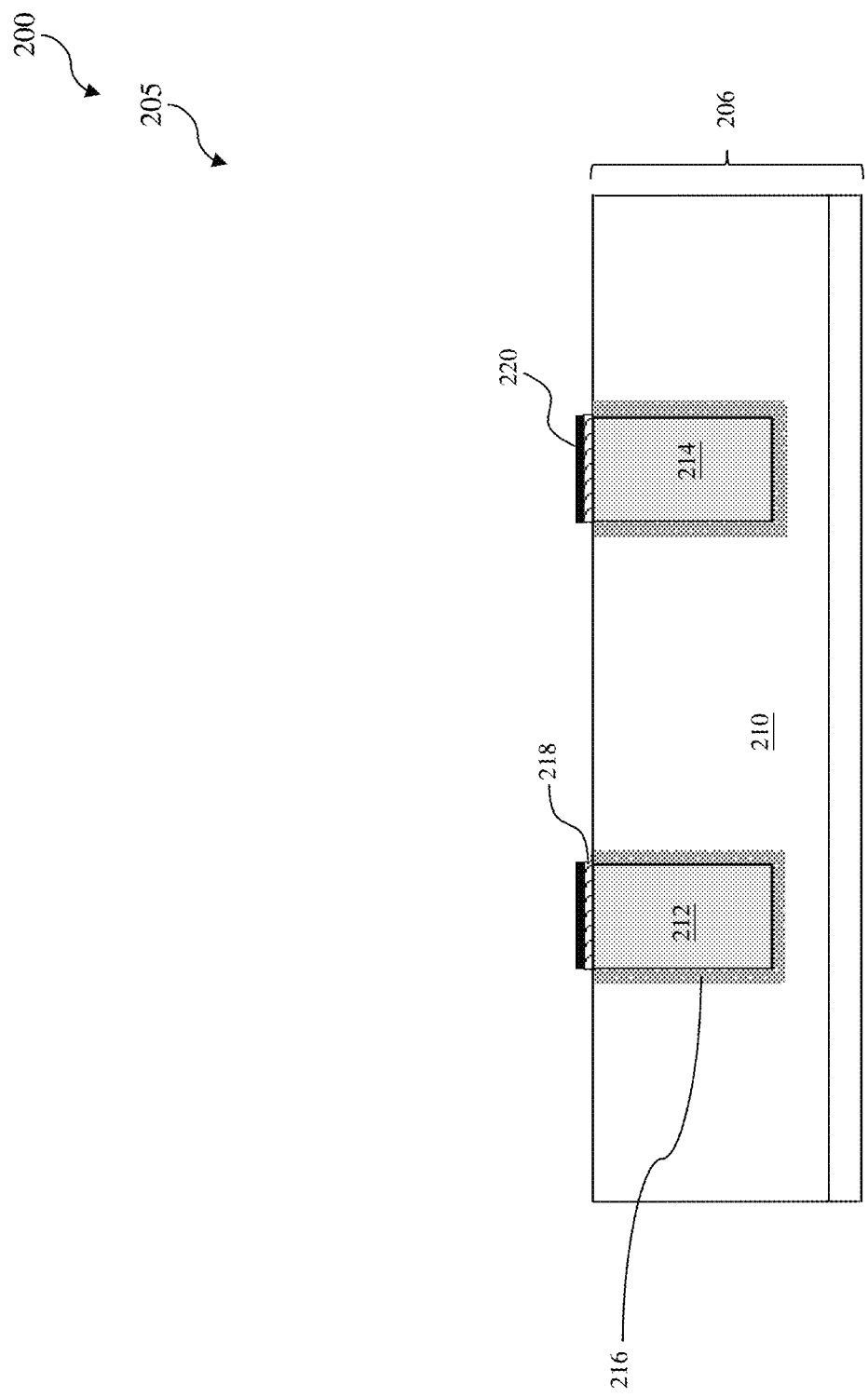

In many embodiments, as illustrated in FIG. 3A and described above, the graphene layer 220 selectively deposits over the selective metal capping layer 218 (or, if not present, over the conductive features 212 and 214) while leaving the remaining portions of the substrate (206) surface substantially free from the graphene layer 220. The selectivity may have originated from the catalytic property of the metallic substrate facilitating graphene growth. For example, the metallic substrate enables low activation energy pathways for the dissociation of graphene precursors, the nucleation of graphene particles, and the growth and merging of the graphene domains. Accordingly, the graphene layer 220 includes a plurality of graphene layer segments. The graphene layer may be formed by any appropriate methods. These methods will be detailed later with reference to FIG. 5.

Figure 3B:
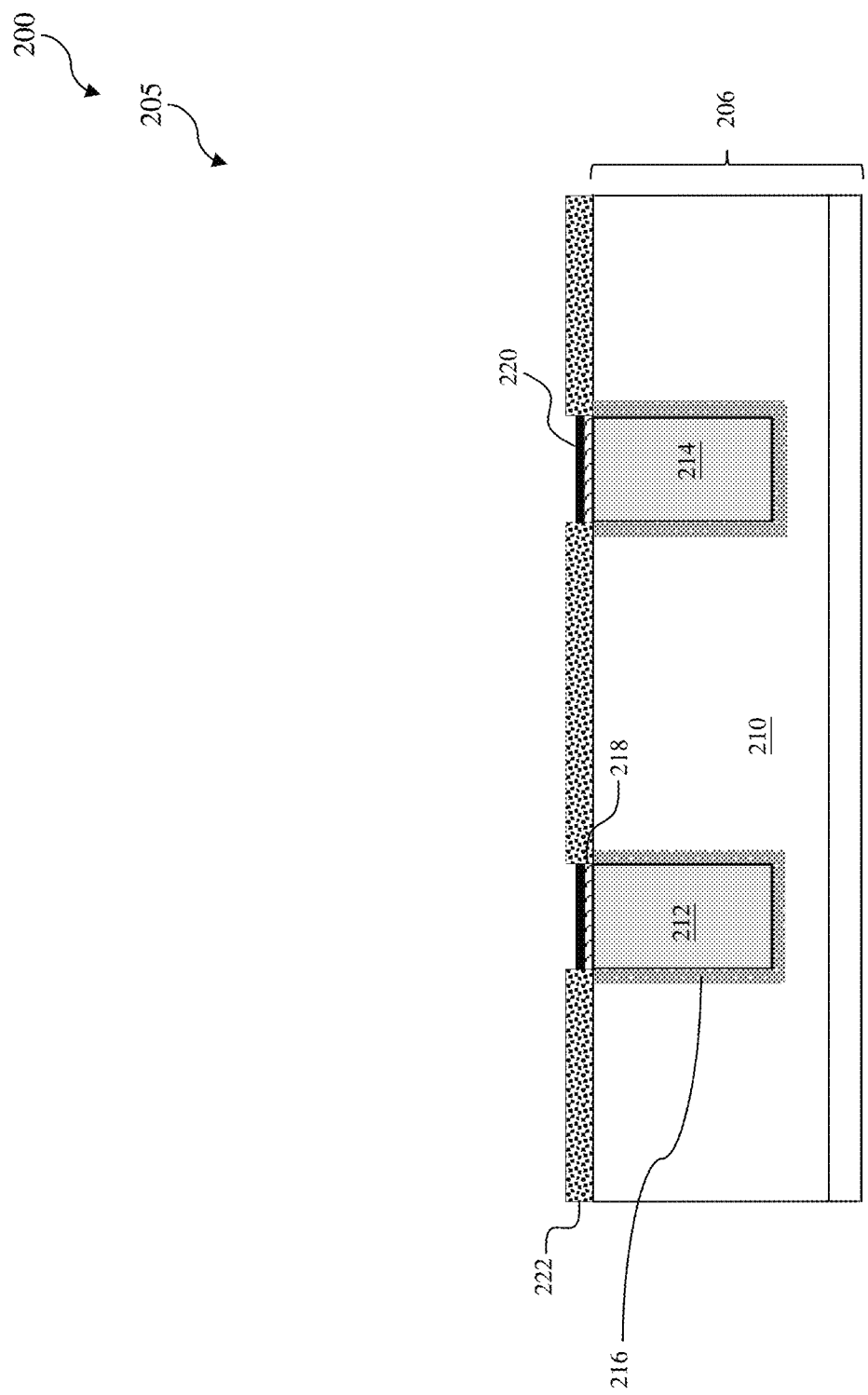

Turning to the block 108A of FIG. 1 and FIG. 3B, the method 100 includes forming a selective ESL 222 over portions of the substrate 206 that are not covered by the segments of graphene layers 220 (and not covered by the segments of selective metal capping layers 218, if present). The selective ESL 222 may include any suitable materials, for example, materials that are capable of forming a layer selectively over hydrophilic surfaces but not over hydrophobic surfaces. Without being limited by theory, because graphene is hydrophobic, the selective ESL 222 does not form over the graphene layer 220. In effect, the graphene layer 220 serve as templates in the formation of the selective ESL 222. Exemplary materials for the selective ESL 222 include metal oxides, metal carbide, metal nitride, silicon oxide or silicon carbide, silicon nitride, such as aluminum oxide ($Al_2O_3$), aluminum oxynitride (ALON), zirconium oxide ($ZrO_2$), tungsten carbide (WC), tungsten oxycarbide ($W_2CO$), silicon oxide ($SiO_2$), silicon oxynitride ($SiO_yN_x$), silicon oxycarbide ($SiO_yC_x$), or combinations thereof. The selective ESL 222 may be formed by any proper processes, for example, by ALD, CVD, PEALD, PECVD, or combinations thereof. The formation may be conducted, for example, at a temperature between about 200° C. and about 400° C. and at a pressure between about 0.5 torr and about 10 torr.

As illustrated in FIG. 3B, the formed selective ESL 222 includes a plurality of segments. The segments of the selective ESL 222 each separates various segments of the graphene layer 220 from each other, such as the segment of the graphene layer 220 over the conductive feature 212 and the segment of the graphene layer 220 over the conductive feature 214. In many embodiments, the selective ESL ensures proper electric insulation between the various segments of the graphene layer 220. The thickness of the selective ESL 222 may be between about 5 Å and about 100 Å. In one embodiment, as illustrated in FIG. 3B, the selective ESL 222 has a thickness larger than that of the graphene layer 220 (or the combined thickness of the graphene layer and the selective 218, if present). Therefore, the selective ESL 222 has a top surface that extends above a top surface of the graphene layer 220. In other embodiments (not shown) however, the selective ESL 222 may have a thickness equal to or smaller than that of the graphene layer 220 (or the combined thickness of the graphene layer and the selective 218, if present). Therefore, the selective ESL 222 may have a top surface that extends along or below a top surface of the graphene layer 220.

Figure 3C:
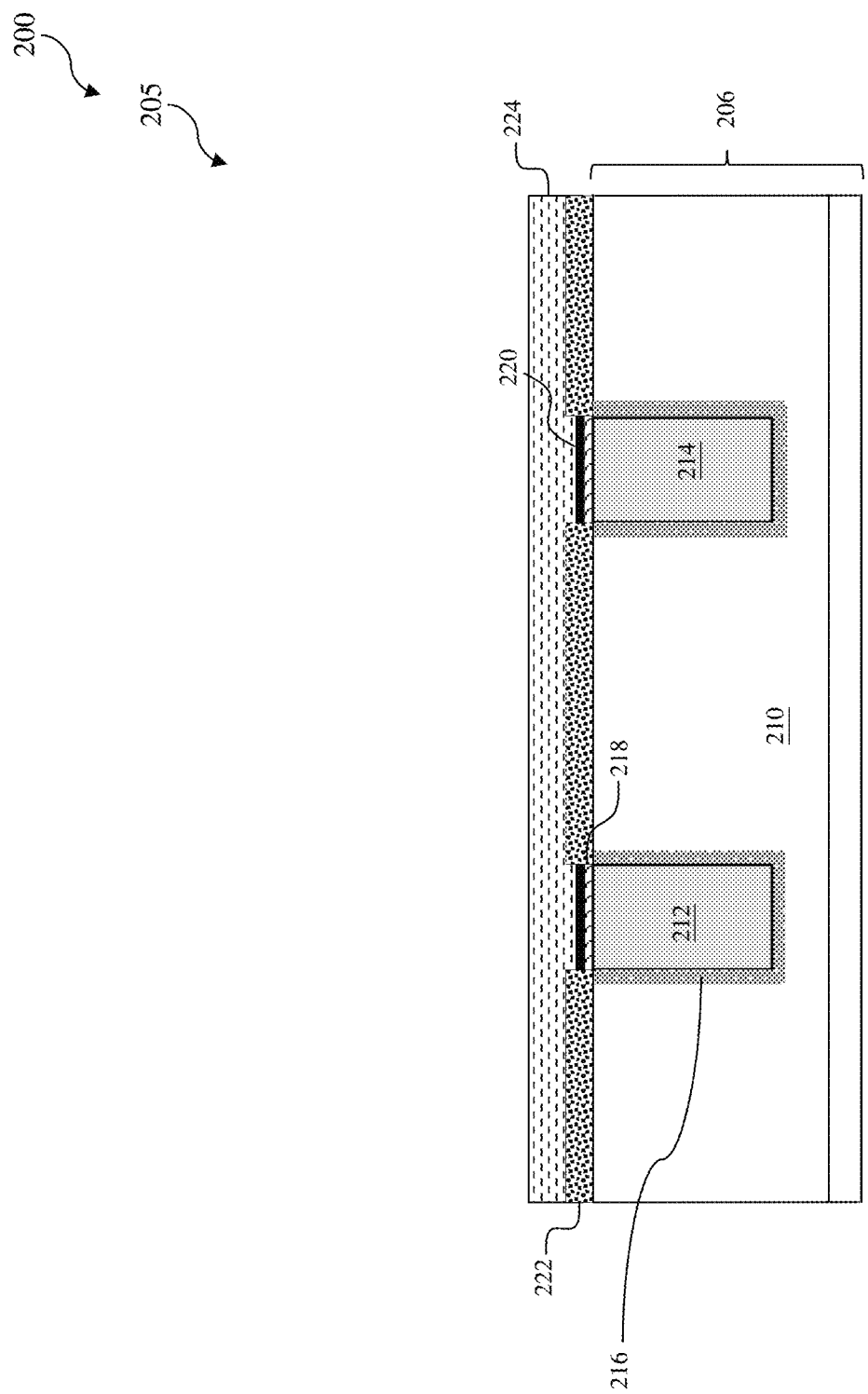
Figure 3D:
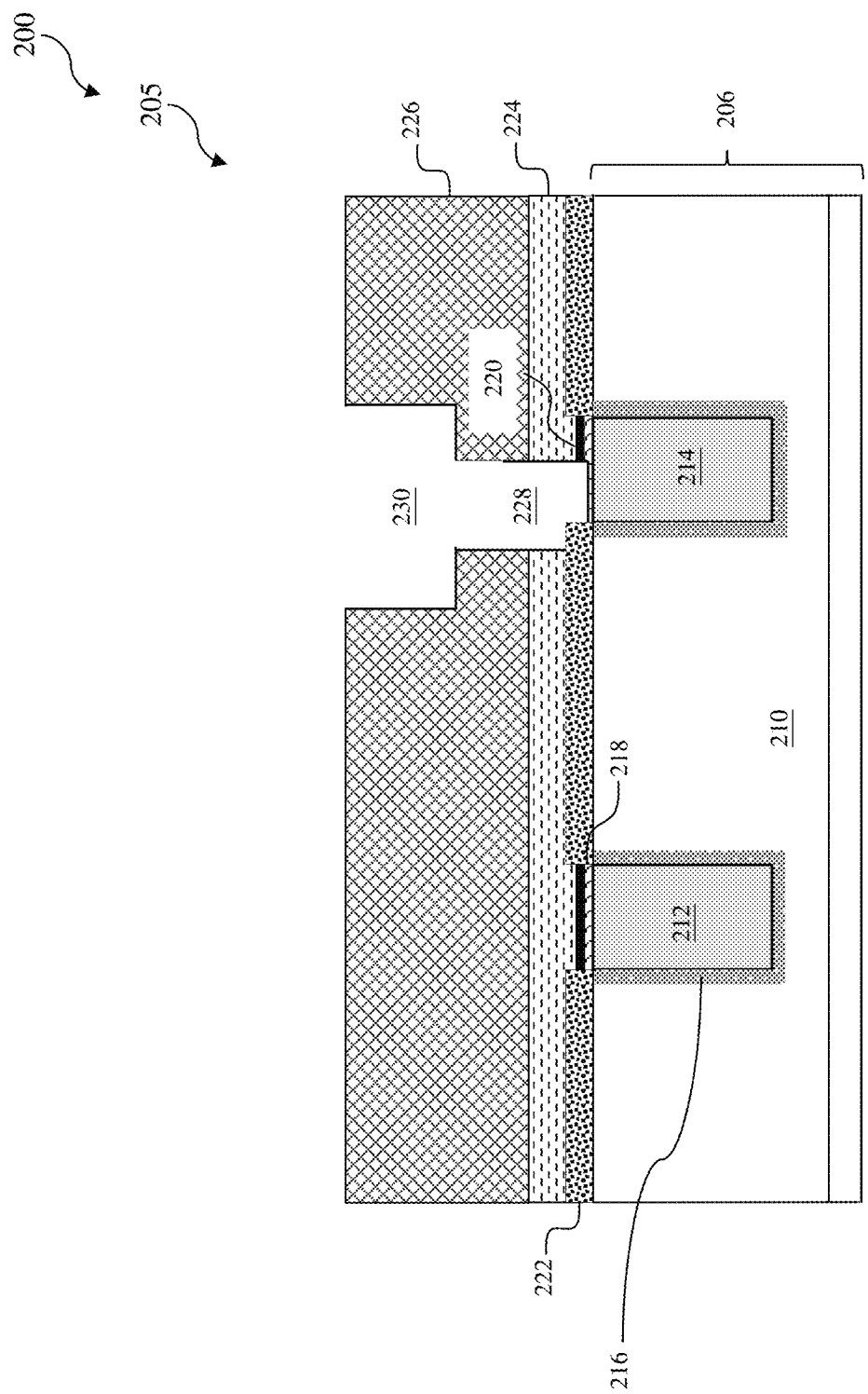

Turning to the block 114 of FIG. 1 and FIG. 3C, the method 100 includes forming a continuous ESL 224 over the substrate 206. For example, in the depicted implementation, the continuous ESL 224 is formed over the graphene layer 220 over the conductive features 212 and 214, and over the selective ESL 222 in the remaining portions of the surface. The continuous ESL 224 may include any suitable materials that has sufficient etching selectivity as relative to the materials of the selective ESL 222 towards an etchant, such that in an etching process, the continuous ESL 224 may be removed substantially in its entirety without substantially removing the selective ESL 222. Accordingly, the selective ESL 222 remain substantially unchanged. The material may include for example, metal oxides, metal carbide, metal nitride, silicon oxide or silicon carbide, silicon nitride, or more specifically, aluminum oxide ($Al_2O_3$), aluminum oxynitride (ALON), zirconium oxide ($ZrO_2$), tungsten carbide (WC), tungsten oxycarbide ($W_2CO$), silicon oxide ($SiO_2$), silicon oxynitride ($SiO_yN_x$), silicon oxycarbide ($SiO_yC_x$), or combinations thereof. The continuous ESL 224 may have a thickness of about 5 Å to about 30 Å and be formed by any suitable methods. For example, the continuous ESL 224 may be formed by ALD, CVD, PEALD, PECVD, or combinations thereof. The formation may be conducted, for example, at a temperature between about 200° C. to about 400° C. and at a pressure between about 0.5 torr to about 10 torr.

The method 100 then proceeds to form additional layers and devices in the substrate 206. Turning to the block 116 of FIG. 1 and FIG. 3D, the method 100 includes forming a dielectric layer 226. The dielectric layer 226 may be an ILD. The dielectric layer 226 may include a dielectric material such as silicon nitride. Alternatively, other dielectric materials may be used. The dielectric layer 226 may be deposited over various devices formed into the semiconductor substrate 206. For example, the dielectric layer 226 may be deposited over transistor devices, which include gate, source, and drain components. The dielectric layer 226 may be formed in multiple layers, each layer having a particular configuration of interconnect lines, such as metal lines and via features. In the depicted embodiment, the dielectric layer 226 is formed over conductive features 212 and 214.

Subsequently, a via hole 228 and a metal line trench 230 are formed, for example, over the conductive feature 214 and within the dielectric layers 226 and 224. Any proper method, such as a variety of lithographic, etching, and deposition processes, may be used to form the via hole 228 and the metal line trench 230. For example, the via hole 228 may be formed first by an etching process that is applied to form a hole extending from a top of the dielectric layer 226 down to the conductive feature 214. Then, a second patterning and etching process may be applied to form the metal line trench 230. In one embodiment, one or more wet etching processes may be used to form the via hole 228 and the metal line trench 230. As described above, the wet-etchant is selected such that the continuous ESL 224 is etched through while the selective ESL 222 is not substantially affected. In some implementations, the metal capping layer 218 is partially etched. In other implementations, the metal capping layer 218 is etched through, such that the conductive feature 214 is exposed through the via hole 218. In another embodiment, one or more dry etching processes may be used instead to selectively remove the continuous ESL 224.

In the case of a wet etching removal process, the wet cleaning component may include at least one of the following compounds: Tolunitrile, 4-Methyl-3-nitrobenzonitrile, 4-(Bromomethyl)benzonitrile, 4-(Chloromethyl)benzonitrile, 2-Fluoro-4-(trifluoromethyl)benzonitrile, 4-(Trifluoromethyl)benzonitrile, Diethylene glycol monobutyl ether, 2-(2-Butoxyethoxy)ethyl acetate, Diethylene glycol dimethyl ether, Dimethyl sulfoxide, Dimethylformamide, Poly(ethylene glycol) bis(amine), (2-Methylbutyl)amine, Tris(2-ethylhexyl)amine, (4-Isothiocyanatophenyl)(3-methylphenyl)amine, Poly(ethylene glycol) methyl ether amine, Poly(ethylene glycol) diamine, Triethanolamine hydrochloride, Triethanolamine, Trolamine, Trolamine salicylate, 2-Chloroethyl vinyl ether, 2-[4-(Dimethylamino)phenyl]ethanol, Tetraethylethylenediamine, Ammonium acetate, Ammonium chloride, Ammonium sulfate, Ammonium formate, Ammonium nitrate, Ammonium carbonate, Ammonium fluoride, Ammonium persulphate, Ammonium sulfamate, Ammonium phosphate, 1-Acetylguanidine, or general acid. Furthermore, the wet etching process may use an inhibitor component that includes at least one of the following compounds: 1-Chlorobenzotriazole, 5-Chlorobenzotriazole, 5-Methyl-1H-benzotriazole, 1-methyl-1H-1,2,3-benzotriazole-5-carbaldehyde, 1-Methyl-1H-1,2,3-benzotriazol-5-amine, 1-Methylimidazole, 2-Mercapto-1-methylimidazole, 1-Methylimidazole-2-sulfonyl chloride, 5-Chloro-1-methylimidazole, 5-Iodo-1-methylimidazole, Thiamazole, 1-Methylimidazolium chloride, 2,5-Dibromo-1-methyl-1H-imidazole, 1H-Benzotriazole-4-sulfonic acid, BTA-like, and etc. Such examples are for wet etching processes that are ideal for removing the continuous ESL 224.

In the case of a dry etching removal process, the dry etching process may involve a plasma source that includes capacitively coupled plasma (CCP), radio-frequency (RF), inductively coupled plasma (ICP), micro-wave, or combinations thereof. In one implementation, Ion beam etching (IBE) is used with a power between about 100 and about 2,000 V, a beam angle of about 0 degree to about 70 degrees, and with a gas selected from Helium (He), Neon (Ne), Argon (Ar), Krypton (Kr), and Xenon (Xe). In another implementation, Inductively Coupled Plasma—Reactive Ion Etching (ICP-RIE) is implemented with a transformer coupled plasma power (TCP) between about 100 W and about 1500 W, a Bias voltage of between about 0 V to about 300 V, and a gas of acetic acid, method, ethanol, combinations thereof, or combinations with another organic gas. In yet another implementation, ICP-RIE is implemented with a TCP between about 100 W and about 1500 W, a bias voltage of between about 0 V and about 500V, and a gas of nitrogen ($N_2$), oxygen ($O_2$), argon (Ar), or a fluorinated gas such as $CF_4$, $CHF_3$, $CH_3F$, $CH_2F_2$, $C_4F_8$, $C_4F_6$. In a further implementation, RIE is implemented with a power within a range of about 100 W to about 2000 W, a bias voltage within a range of about 0 V to about 500 V, and a gas of nitrogen ($N_2$), oxygen ($O_2$), argon (Ar), chlorine ($Cl_2$), tetrachlorosilane ($SiCl_4$), borane trichloride ($BCl_3$), or a fluorinated gas such as $CF_4$, $CHF_3$, $CH_3F$, $CH_2F_2$, $C_4F_8$, $C_4F_6$. Such examples are for dry etching processes that are ideal for removing the continuous ESL 224.

The position of the via hole 228 determines the position of a subsequently formed via feature relative to the conductive feature 214. In the depicted embodiment, the via hole 228 is misaligned with the conductive feature 214, which could be a result of imperfections in semiconductor fabrication processing (e.g., inadequate alignment/overlay control, etc.). More specifically, a portion of the via hole 228 is formed over the edge of the conductive feature 214 such that the via hole 228 is positioned closer to the neighboring conductive feature 212 than it is designed, which is unintentional and undesirable. Generally, as the technology node shrinks, the separation between the conductive features continues to shrink. Therefore, in absence of proper insulations, there exists a substantial risk of creating a short circuit between the conductive features 212 and any subsequently formed via feature in the via hole 218. The present disclosure provides the selective ESL 222 that properly insulates the conductive feature 212 not only from the conductive feature 214, but also from the via feature eventually formed in the via hole 228. The risk of short circuit introduced by the misalignment of via hole 228 is thereby eliminated.

Figure 3E:
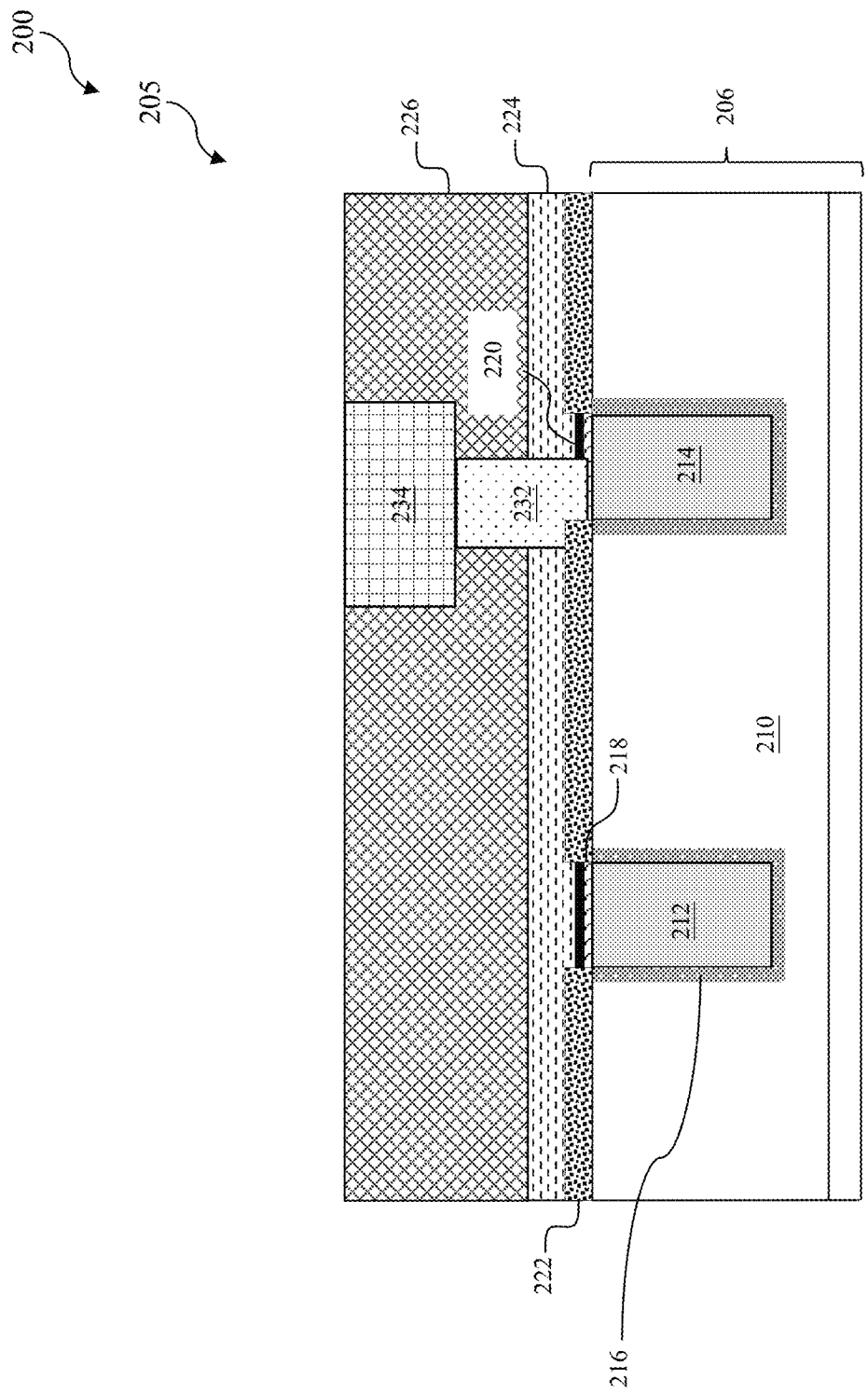

Turning to block 116 of FIG. 1 and FIG. 3E, the method 100 continues to form a via feature 232 within the via hole 228 and over the conductive feature 214. The bottom portion of via feature 232 is at least partially surrounded by the continuous ESL 224. As depicted in FIG. 3E and already discussed above, the via feature 232 is properly insulated from the neighboring conductive feature 212 by the selective ESL 222. Accordingly, any short circuit concern due to the close spacing between the conductive features are eliminated even in case of misalignments.

In the depicted embodiment as illustrated in FIG. 3E, the selective metal-capping layer 218 interposes between the conductive feature 214 and the via feature 232. Therefore, the metal-capping layer 218 ensures proper electron migration between the conductive feature 214 and the via feature 232 over it. Accordingly, the device reliability is improved. Meanwhile, the graphene layer 220 reduces the resistance of the underlying conductive feature 214.

The method 100 may optionally include additional steps to complete the manufacturing of the semiconductor device 200. For example, various additional features, such as metal line 234 may be formed in the metal line trench 230. A Chemical Mechanical Polishing (CMP) process may be performed during this process to planarize and expose the surface of the dielectric layer 226. The via and metal line features may implement various conductive materials including copper, tungsten, and/or silicide.

FIGS. 4A-4G illustrate the second implementation of the method 100. The second implementation of the method 100 may share certain similarities with the first implementation discussed above with reference to FIGS. 3A-3E. As such, for reasons of clarity and consistency, similar components between FIGS. 3A-3E and 4A-4G are labeled the same. Turning back to the block 106B of FIG. 1 and FIG. 4A, the method 100 optionally includes forming a selective blocking layer 219 over the selective metal capping layer 218 (or over the conductive features 212 and 214 if the selective metal capping layer 218 is not present). In the depicted embodiments, the selective blocking layer 219 includes functional groups with a strong affinity, for example, due to a chelating effect, towards a metal of the selective metal capping layer 218. Accordingly, the selective blocking layer 219 selectively forms over the selective metal capping layer 218 while leaving the remaining portions of the surface that does not include the metal free from its coverage. In some implementations, the selective blocking layer 219 forms a self-aligned monolayer (SAM) over the metal capping layer 218. In the depicted embodiment, the ILD 210 remains free of the SAM. The SAM may include functional groups selected from amino, silano, hydroxyl, carbonyl, thiol, sulfonyl, and phosphonic acid groups. The SAM may further include a backbone containing alkyl, aryl, or cycloalkyl components. The SAM may be of different molecular lengths, for example, a length between about 5 Å to about 100 Å. Any suitable methods may be used to form the SAM. For example, SAM may be formed by a solution growth method, a spin-on method, CVD, PECVD, ALD, PEALD, or combinations thereof. As clearly depicted in FIG. 4A, the selective blocking layer 219 includes a plurality of segments.

Figure 4A:
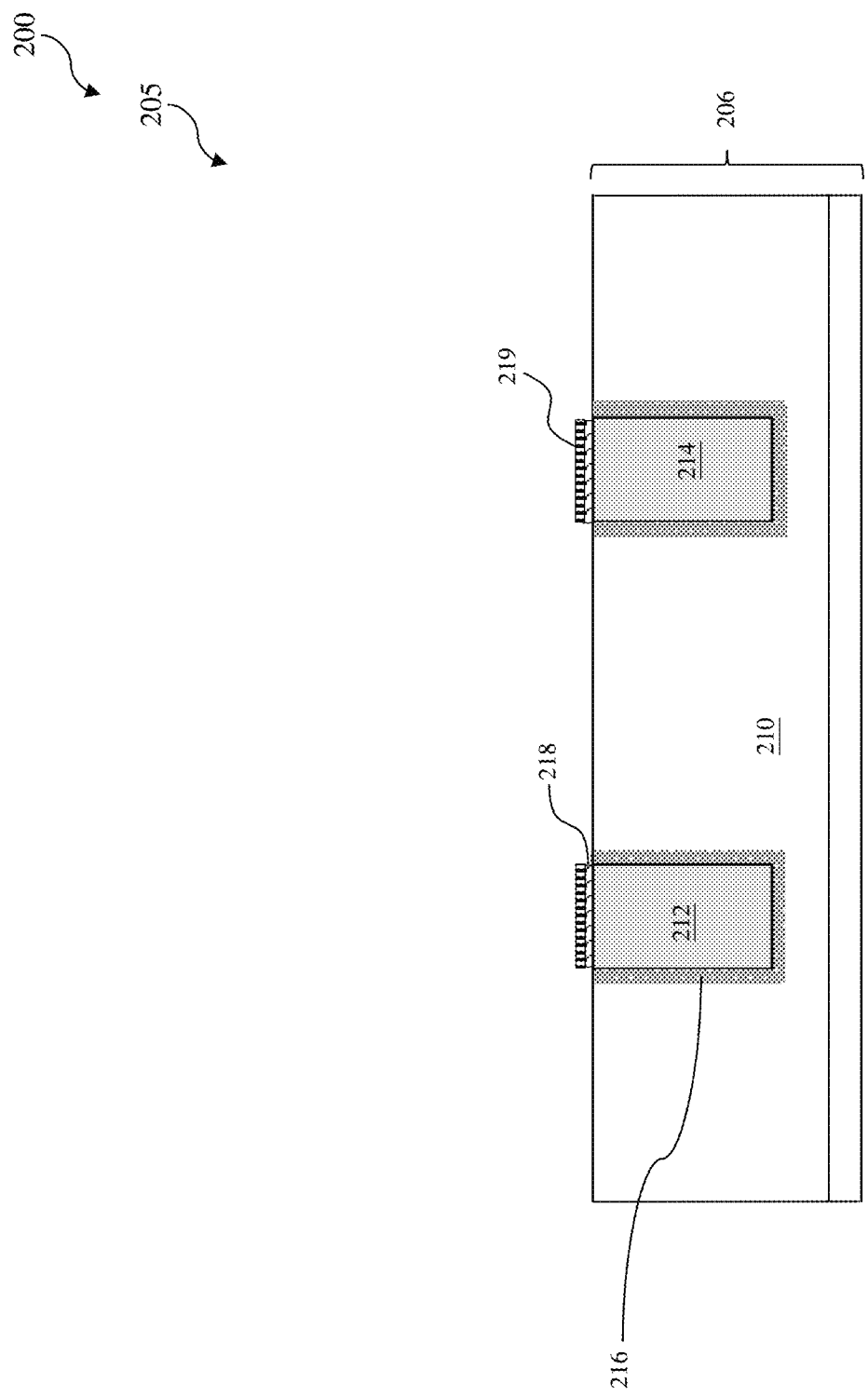
Figure 4B:
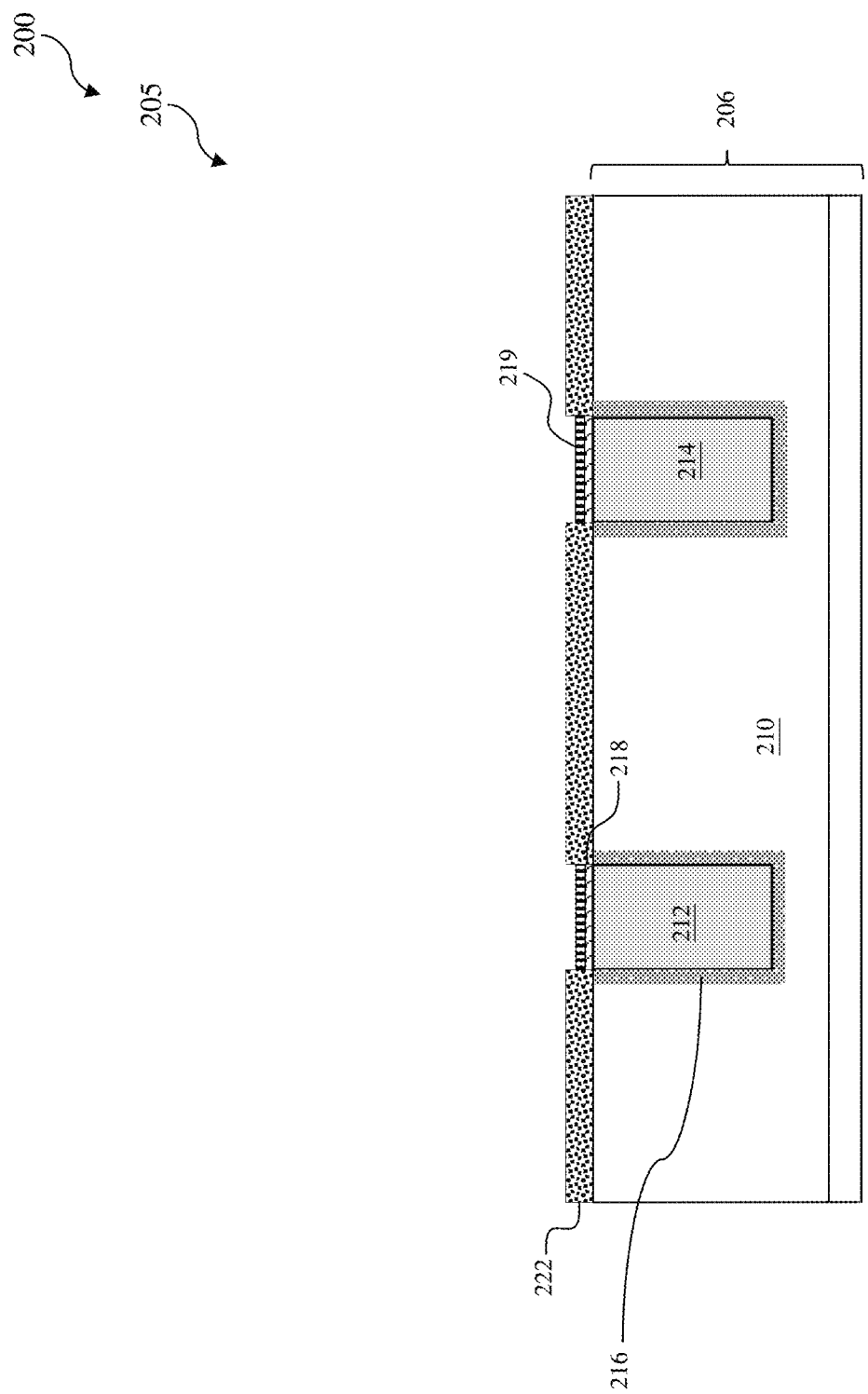
Figure 4C:
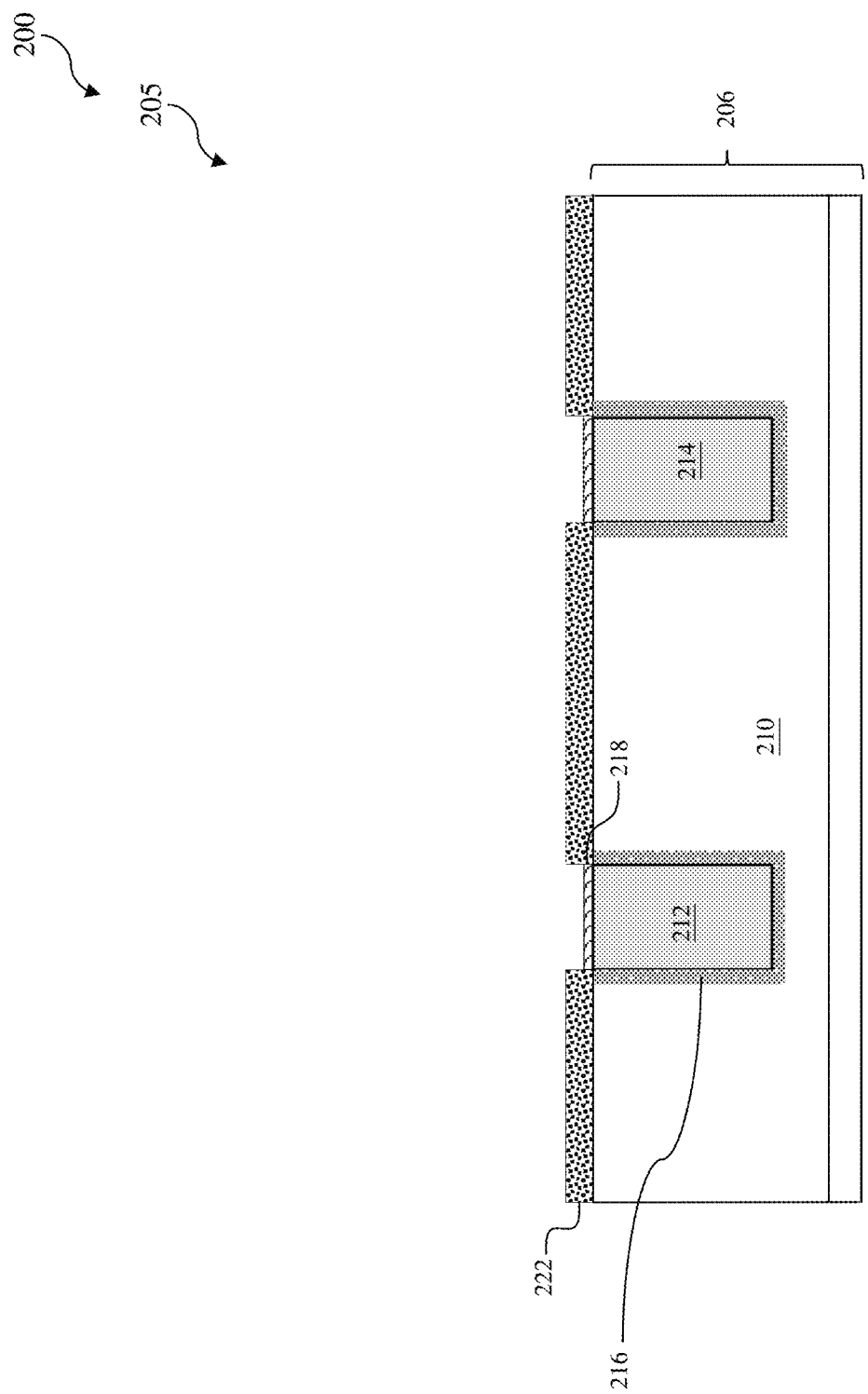
Figure 5:
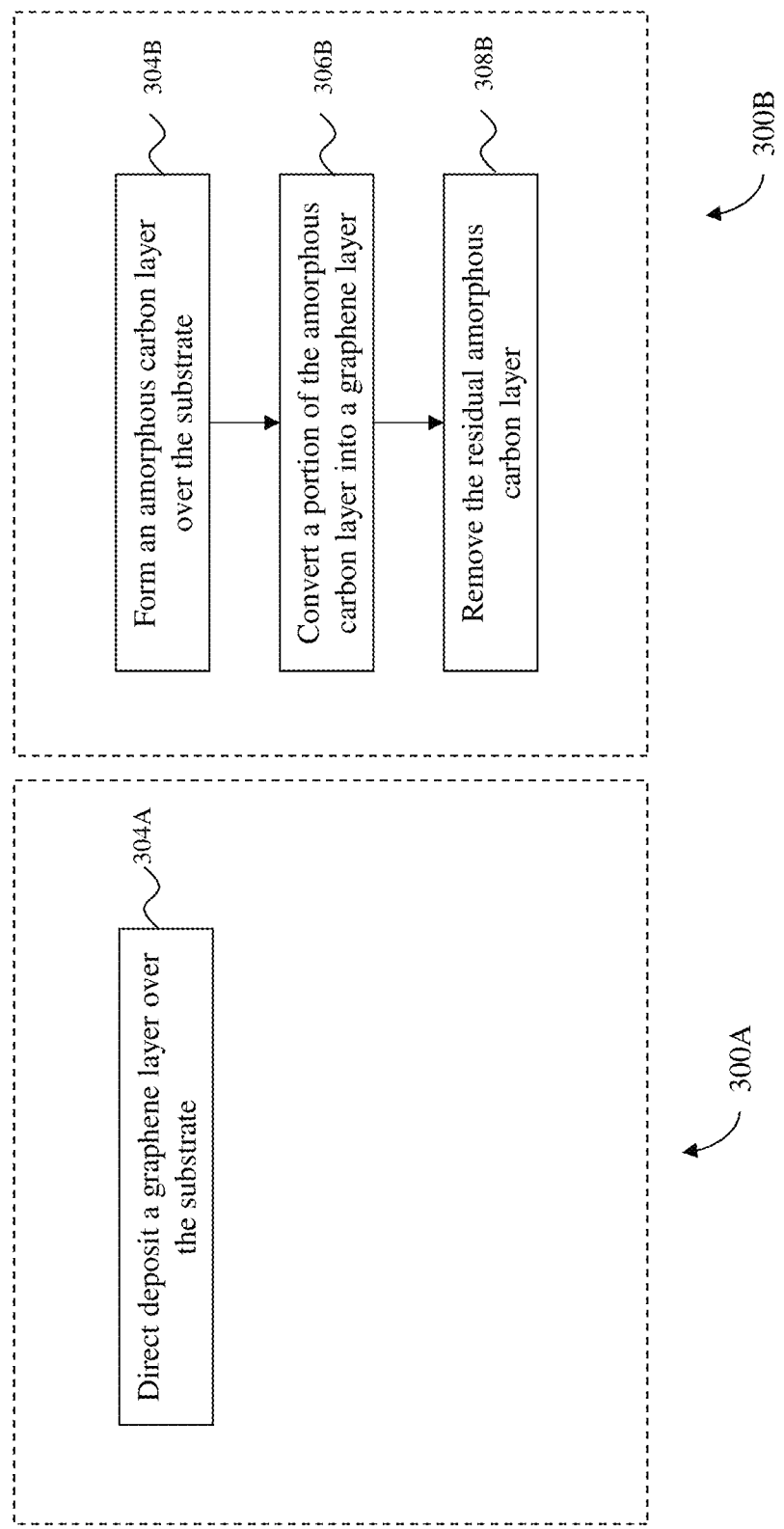
FIG. 5 is a flow chart of a method for forming a graphene layer over a conductive feature, according to various aspects of the present disclosure.

Continuing on to the block 108B of FIG. 1 and FIG. 4B, the method 100 includes forming a selective ESL 222 over portions of the substrate 206 not covered by the segments of the selective blocking layers 219 and the segments of the selective metal capping layers 218 (if present). In effect, these layers 218 and 219 function as a template for the formation of the selective ESL 222. Accordingly, the formed selective ESL 222 includes a plurality of segments. The segments of the selective ESL 222 each separates segments of the graphene layer 220 from each other, such as the segment of the graphene layer 220 over the conductive feature 212 and the segment of the graphene layer 220 over the conductive feature 214. In many embodiments, the selective ESL ensures proper electric insulation between the various segments of the graphene layer 220. The selective ESL 222 may include any suitable materials, such as metal oxides, metal carbide, metal nitride, silicon oxide or silicon carbide, silicon nitride, or more specifically, aluminum oxide ($Al_2O_3$), aluminum oxynitride (ALON), zirconium oxide ($ZrO_2$), tungsten carbide (WC), tungsten oxycarbide ($W_2CO$), silicon oxide ($SiO_2$), silicon oxynitride ($SiO_yN_x$), silicon oxycarbide ($SiO_yC_x$), or combinations thereof. The selective ESL 222 may be formed by any proper processes, for example, ALD, CVD, PEALD, PECVD, or combinations thereof. The thickness of the selective ESL may be between about 5 Å and about 100 Å. Subsequent to the forming of the selective ESL 222, the selective blocking layer 219 may be removed, as illustrated in block 110B of FIG. 1 and FIG. 4C. The selective blocking layer 219 may be removed by any proper means such as a wet etching or a dry etching process.

Figure 4D:
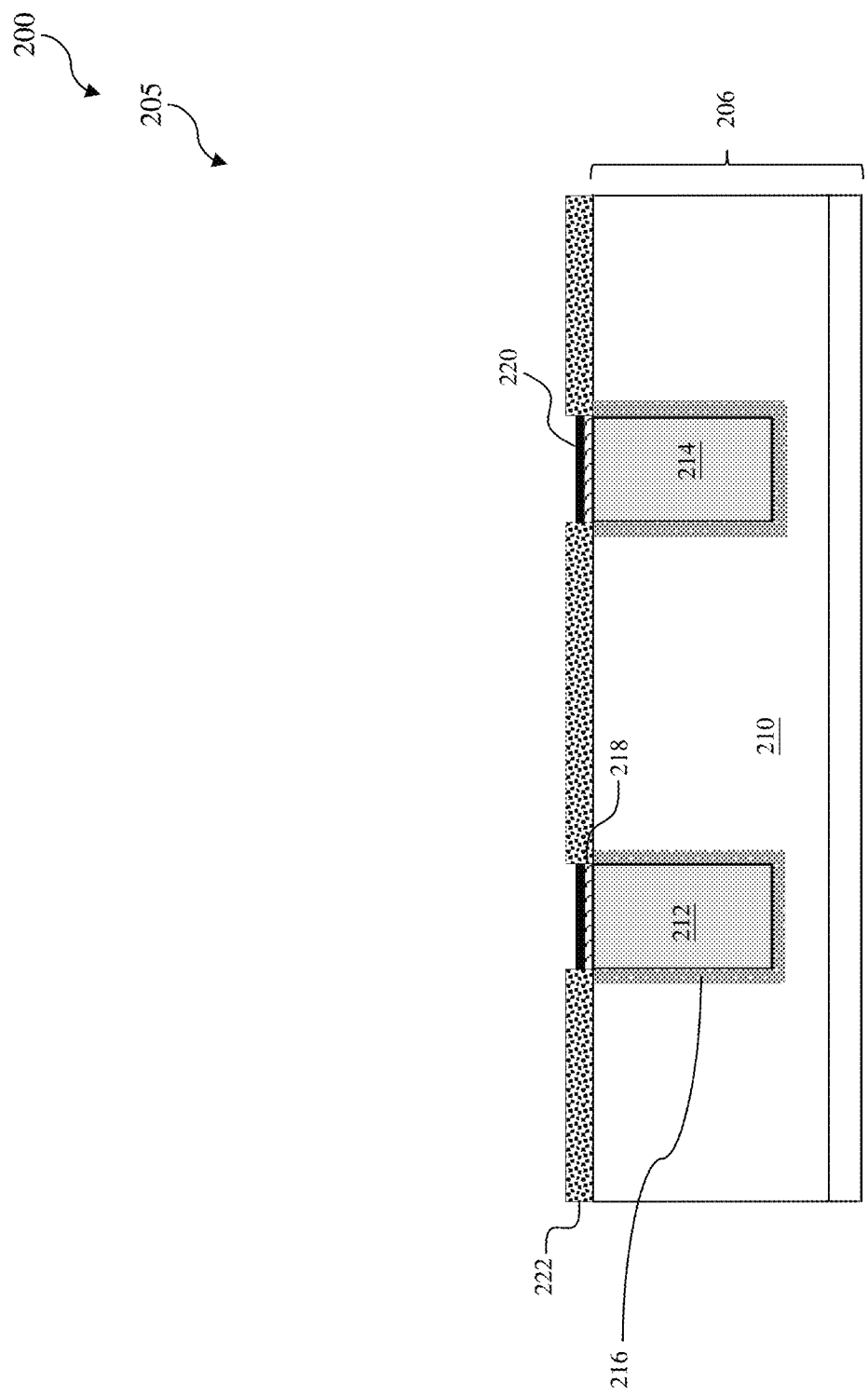
Figure 4E:
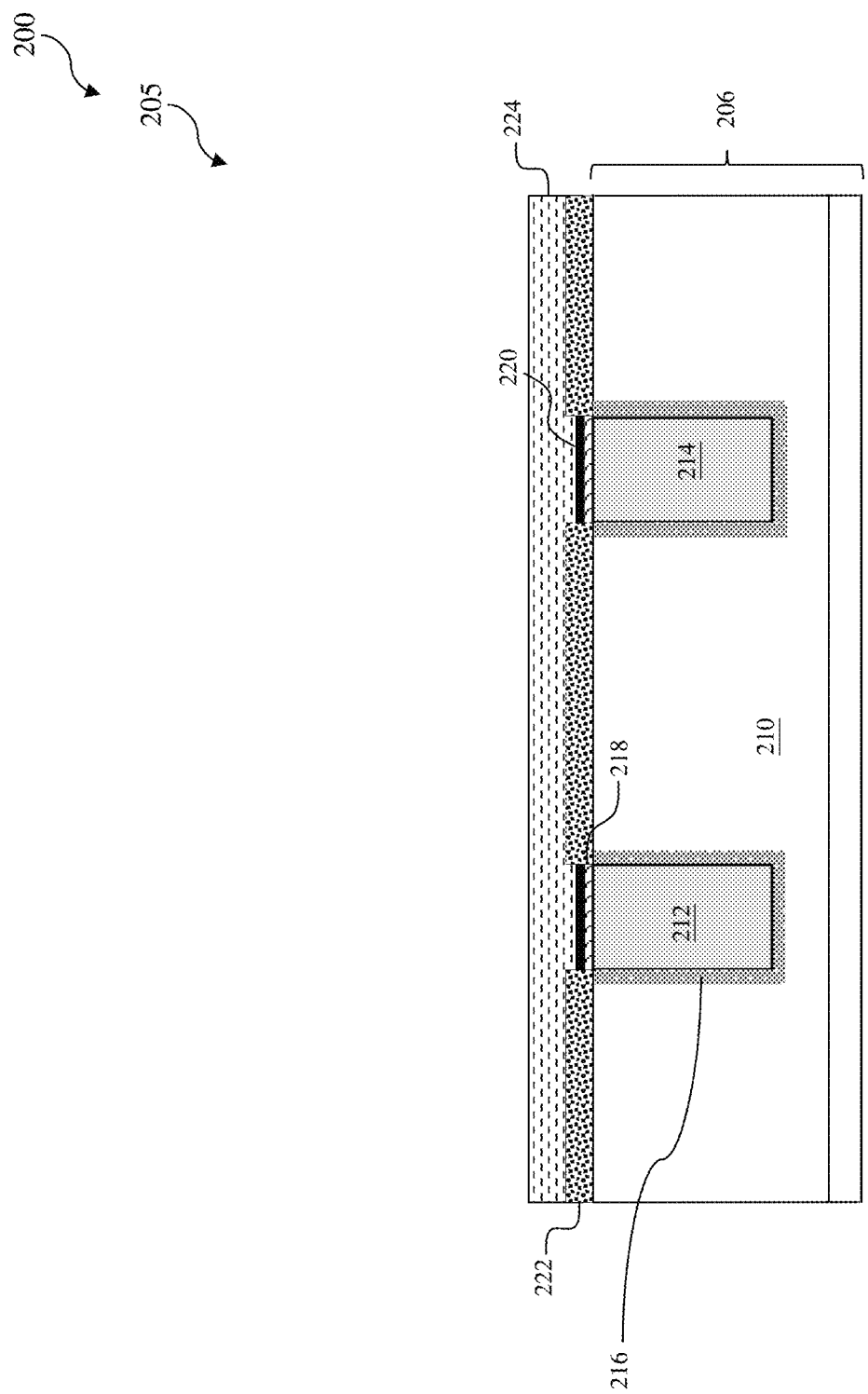
Figure 4F:
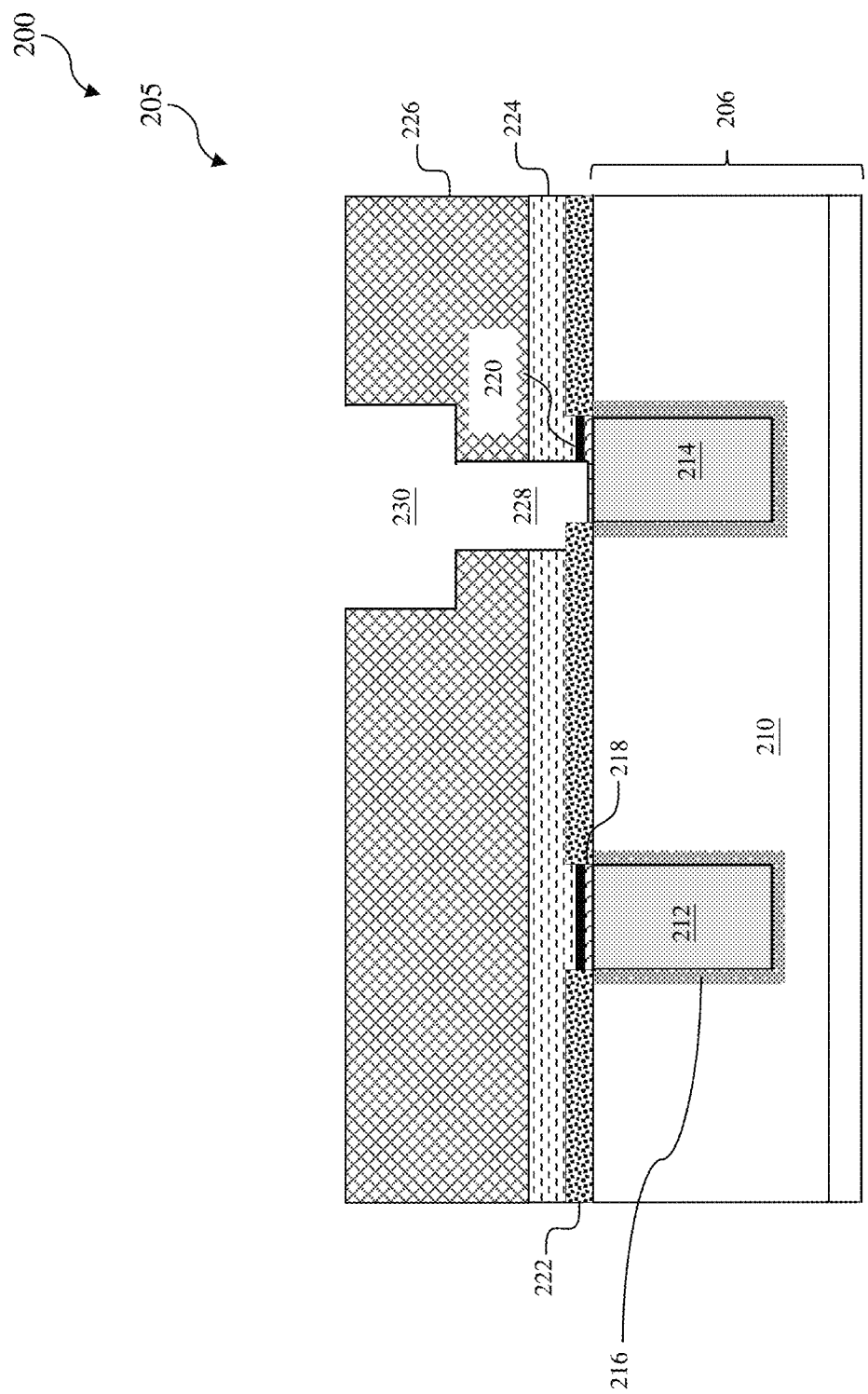

Turning to the block 112B of FIG. 1 and FIG. 4D, the method 100 includes forming a graphene layer 220 over the selective metal capping layer 218, or alternatively when the selective metal capping layer 218 is not formed, over the conductive features 212 and 214. Furthermore, this graphene layer 220 is formed between the plurality of segments of the selective ESL 222. In an embodiment, the graphene layer 220 may include anywhere from 1 to about 10 layers of carbon atoms. In another embodiment, the thickness of the graphene layer is between about 5 Å and about 300 Å. As illustrated in FIG. 4D, the graphene layer 220 has a top surface that extends below a top surface of the selective ESL 222. In many embodiments, the graphene layer 220 selectively deposits over the selective metal capping layer 218 (or, if not present, over the conductive features 212 and 214) while leaving the remaining portion of the substrate surface free from the graphene layer 220. In the depicted embodiment in FIG. 4D, the graphene layer 220 is formed over the selective metal capping layer 218. The graphene layer may be formed by any appropriate methods. These methods will be detailed later with reference to FIG. 5. In many implementations, the materials of the selective metal capping layer 218 (or, if not present, the conductive features 212 and 214) serves as a catalyst for graphene growth.

Figure 4G:
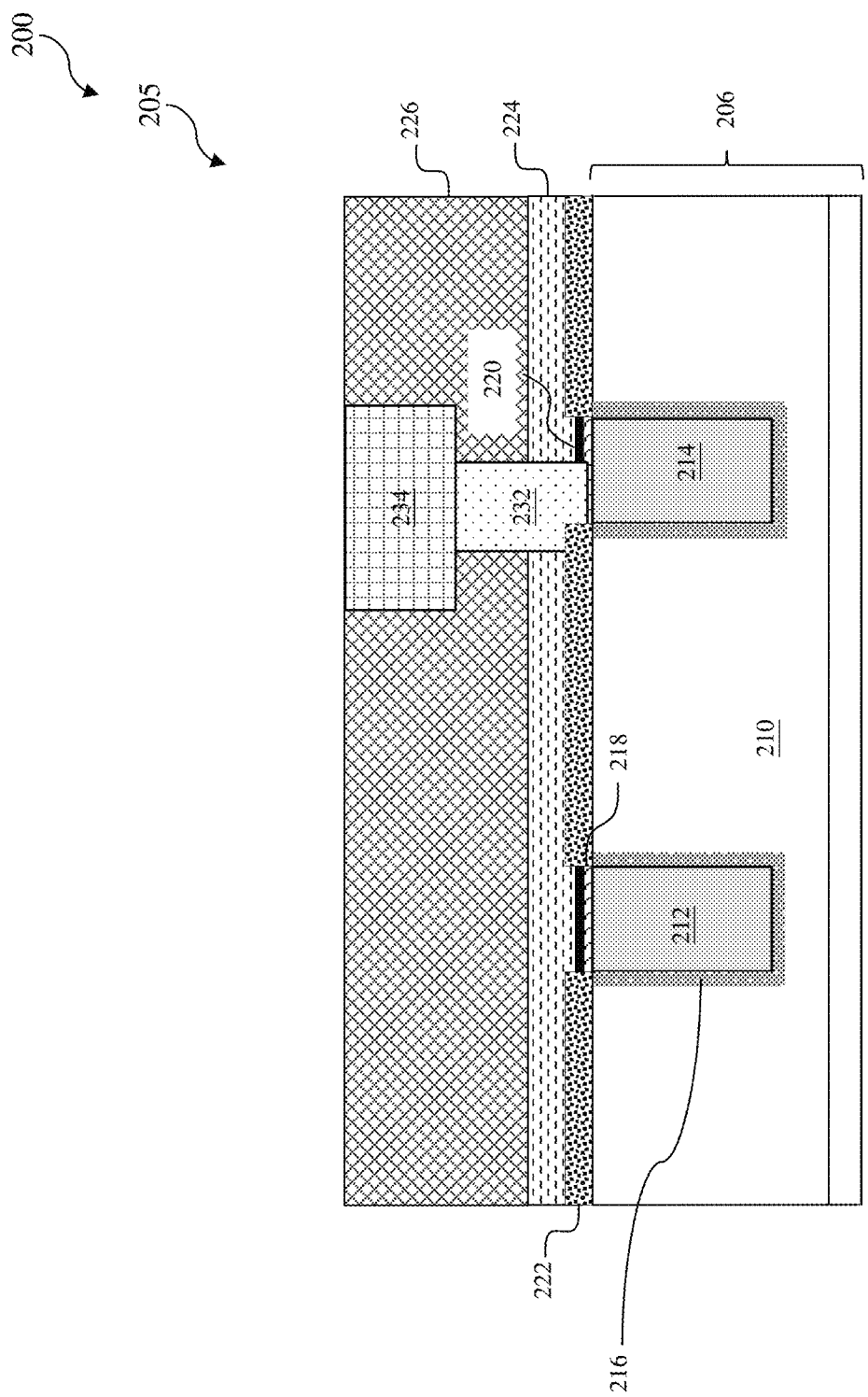

At this stage, the method 100 continues to form the continuous ESL 224 (FIG. 4E), the dielectric layer 226 (FIG. 4F), the via hole 228 (FIG. 4F), the metal line trench 230 (FIG. 4F), a via 232 (FIG. 4G), and a metal line 234 (FIG. 4G). These steps may be substantially similar to those already described for FIGS. 3C-3E. The final structure also resembles the final structure shown in FIG. 3E.

As described above, the graphene layer 220 may be formed by any proper method. FIG. 5 is a flowchart showing two illustrative methods 300A and 300B for forming the graphene layer 220. Different semiconductor structures may result based on the different method used in forming the graphene layer 220.

The method 300A involves a direct deposition method, for example, ALD, CVD, PEALD, PECVD, or combinations thereof with a carbonaceous precursor, such as carbon. The graphene layer 200 directly forms over the substrate in a direct deposition process. In one implementation, ALD is used to directly deposit the graphene layer over the exposed metal surface of the conductive features 212 and 214 (or when the selective metal capping layer 218 is present, over the exposed metal surface of the selective metal capping layer 218). In many embodiments, the direct deposition selectively forms the graphene layer over the metal surface due to the catalytic property of the metal surface (such as Ni, Co, Fe, and Cu) in assisting the graphene growth. For example, the metallic surface enables low activation energy pathways for the dissociation of graphene precursors, the nucleation of graphene particles, and the growth and merging of the graphene domains. The deposition process may be conducted at a temperature between about 100° C. and about 1,000° C., and at a pressure between about 0.5 torr and about 10 torr. The implementations illustrated in FIGS. 3A-3E and FIGS. 4A-4G both utilize the method 300A in forming the graphene layer 220. As can be seen from FIGS. 3E and 4G, the graphene layer 220 overlays the selective metal capping layer 218 and leaves the remaining portions of the surface free from its coverage.

Alternatively, an amorphous carbon deposition process may be used to instead form the graphene layer 220. The structure formed by this process differs from the direct deposition method in that the graphene layer forms below the selective metal capping layer 218. Method 300B of FIG.

Figure 6A:
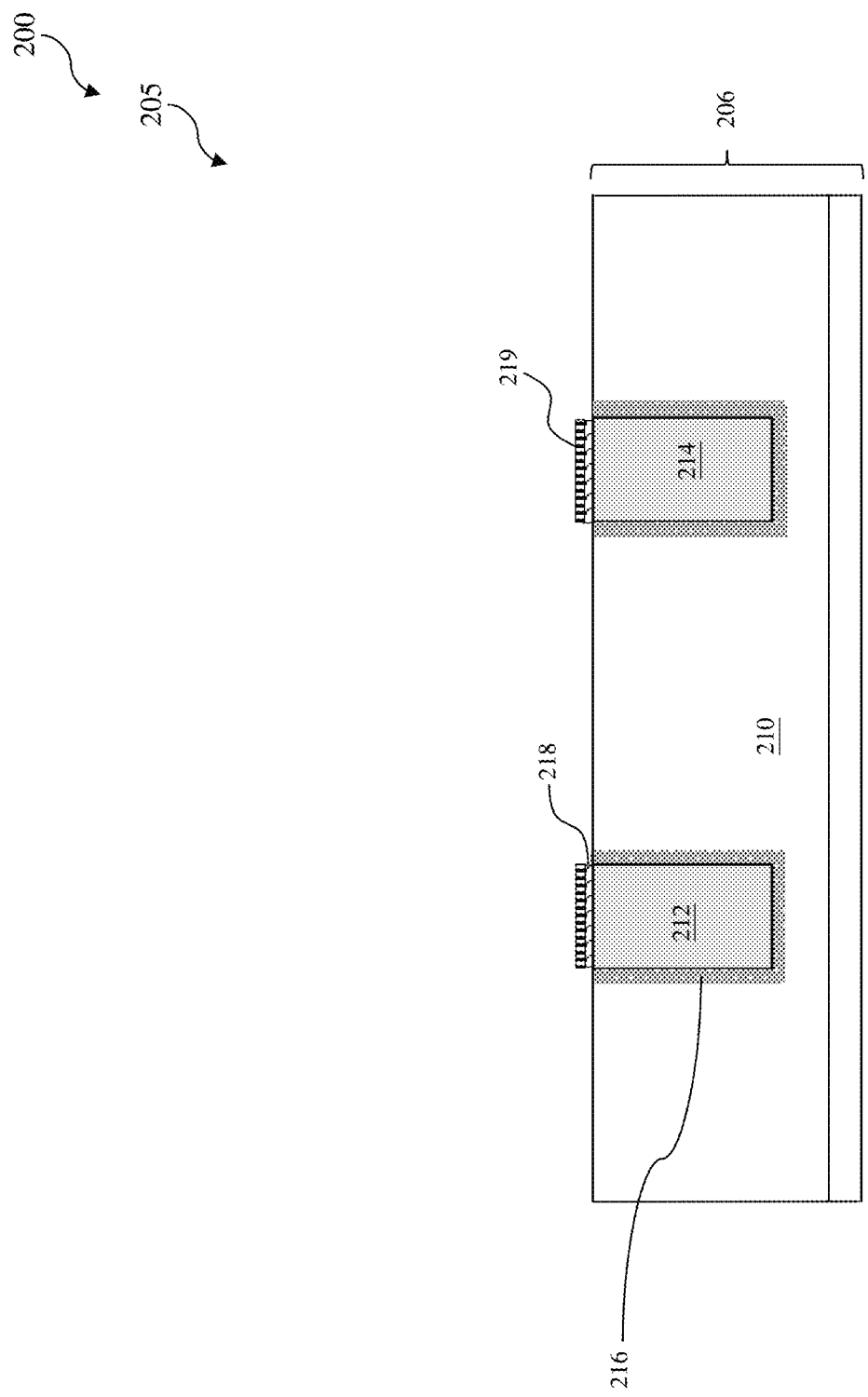
Figure 6B:
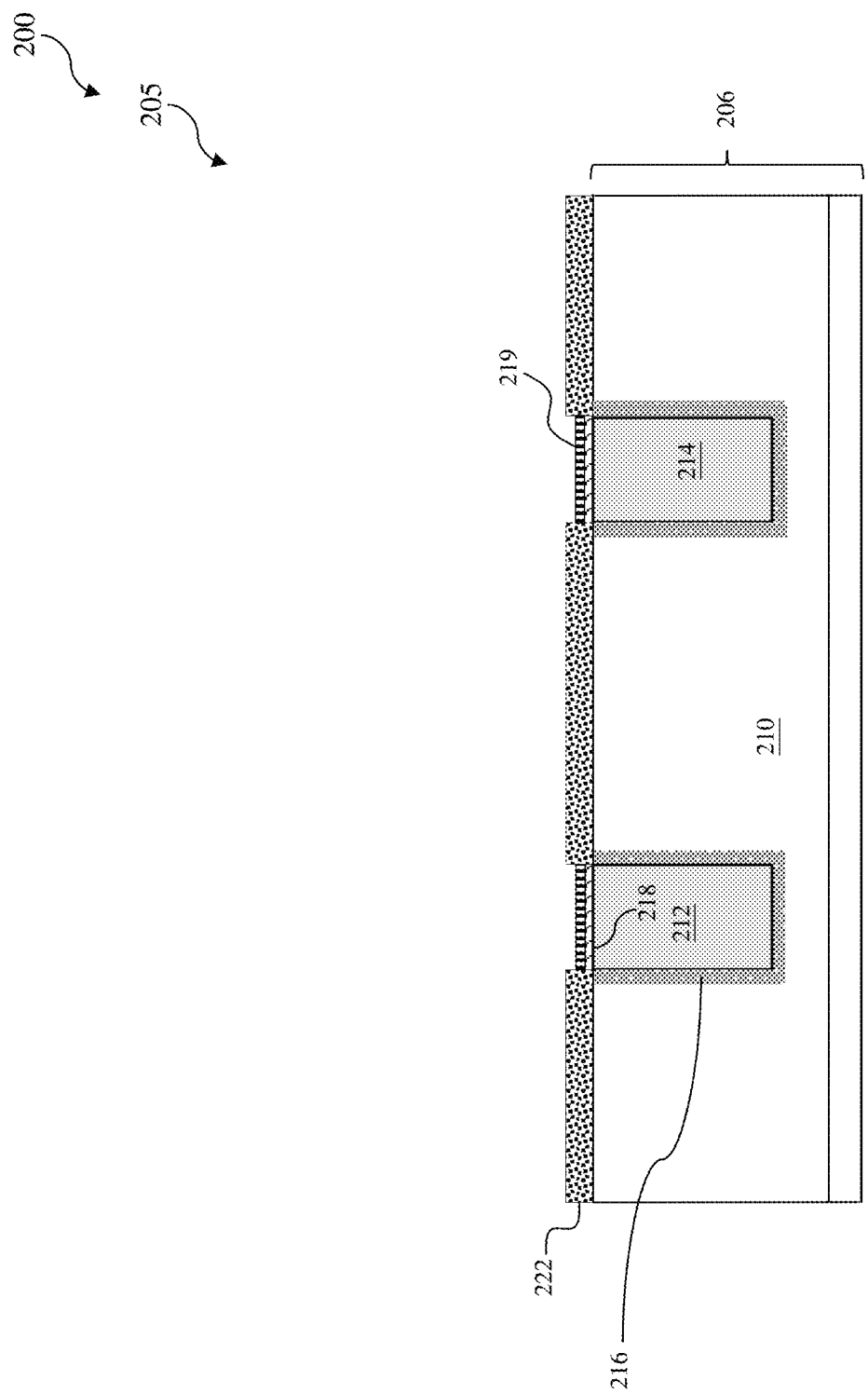
Figure 6C:
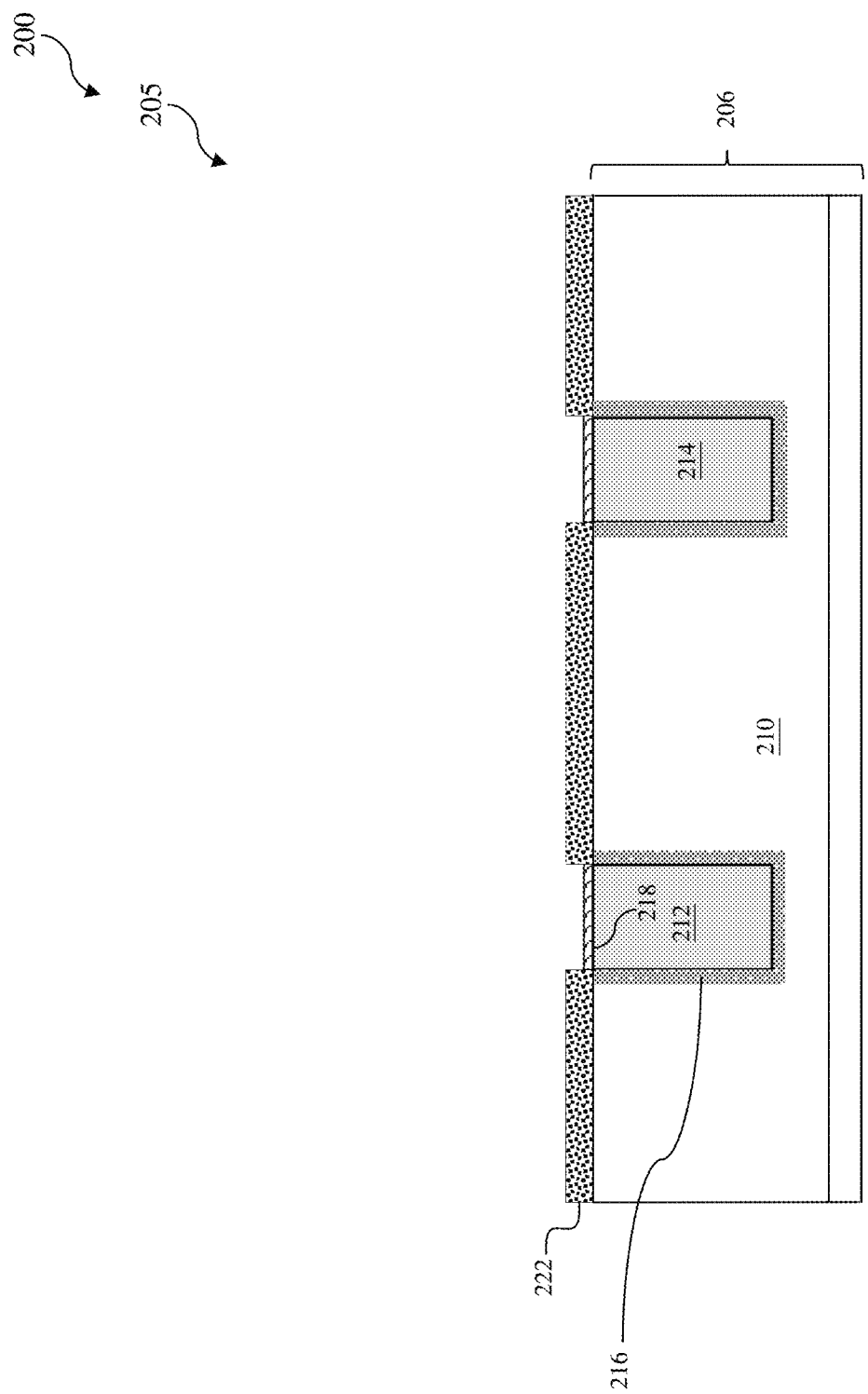
Figure 6D:
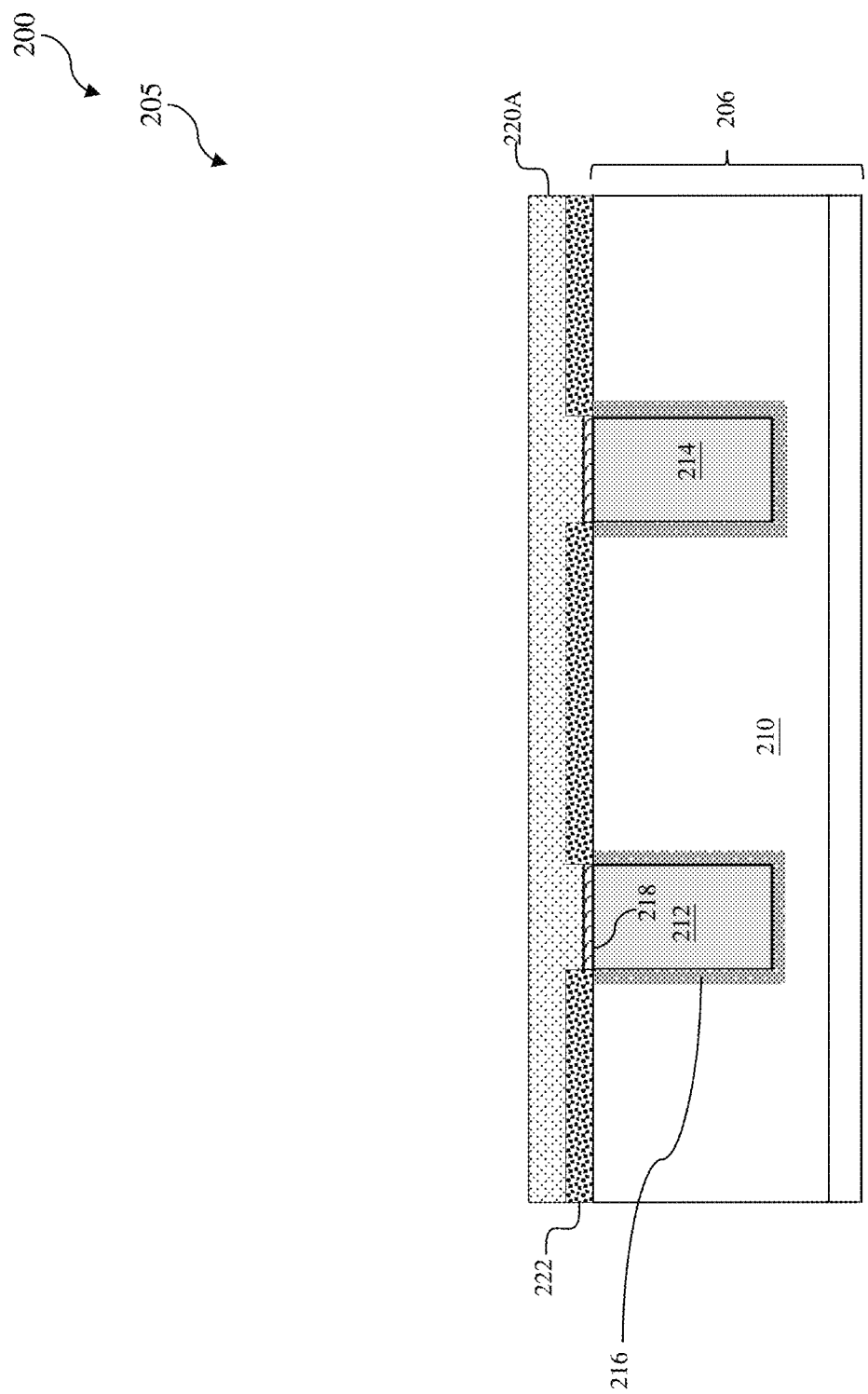

5 illustrates one such implementation. Turning to blocks 304B-308B of FIG. 5, and FIGS. 6A-6K, the method 300B is illustrated as the third embodiment. This embodiment generally resembles the second embodiment (FIGS. 4A-4G) with the exception that the graphene layer 220 is formed via an amorphous carbon deposition process, rather than the direct deposition process discussed above. In the depicted embodiment, the method 100 proceeds through forming a selective blocking layer 219 (FIG. 6A), forming a selective ESL 222 (FIG. 6B), and removing the selective blocking layer 219 to form a structure of FIG. 6C. At this stage, as shown in FIG. 6D and block 304B of FIG. 5, the method 100 proceeds to deposit an amorphous carbon layer 220A over the metal capping layer 218 and the selective ESL 222. The amorphous carbon deposition process may be one of PVD, ALD, CVD, PEALD, or PECVD. For example, the amorphous carbon layer may be deposited using PVD at a temperature between about 25° C. to about 200° C. The amorphous carbon layer 220A may have a thickness within a range of about 50 Å to about 1000 Å.

Figure 6E:
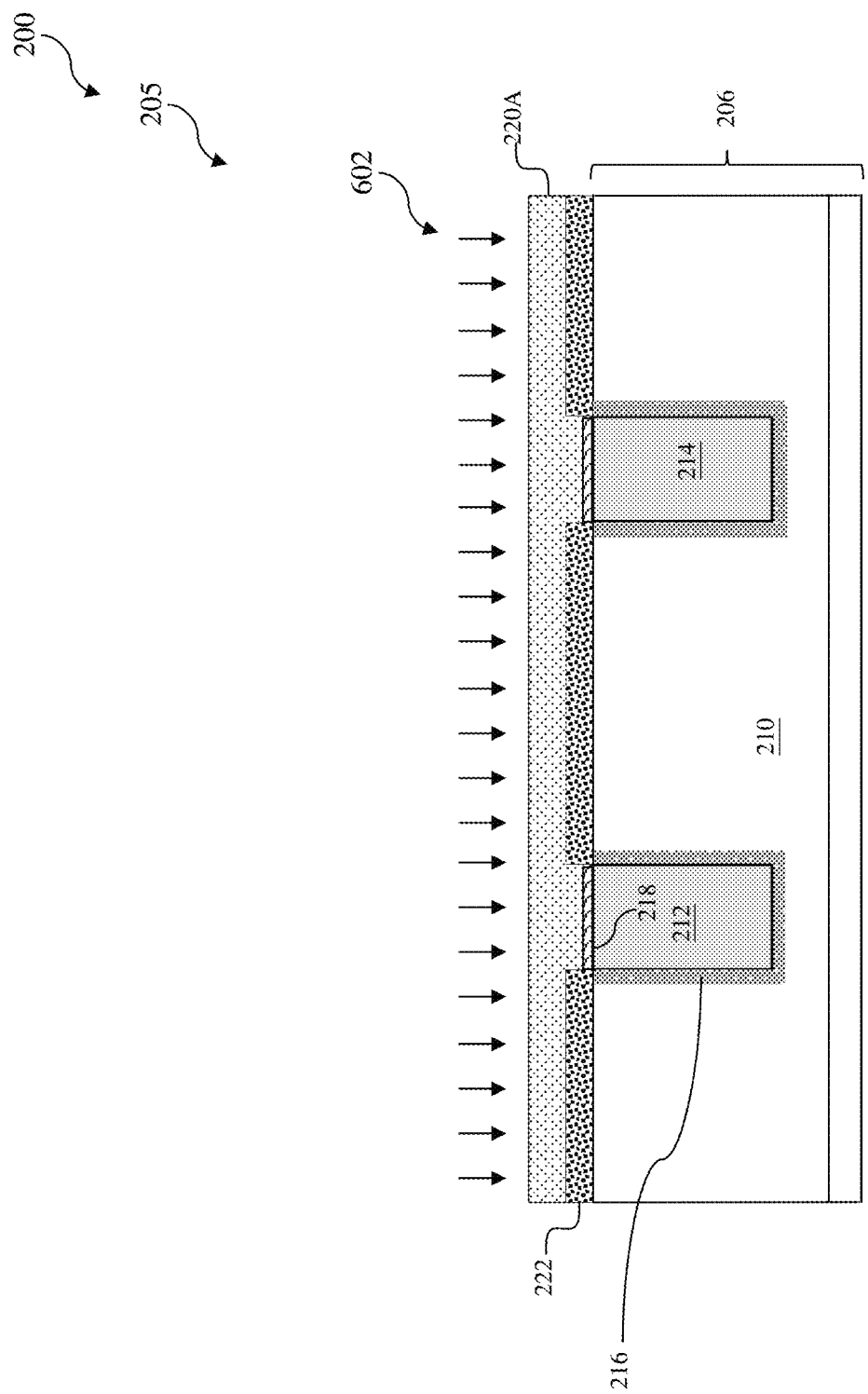
Figure 6F:
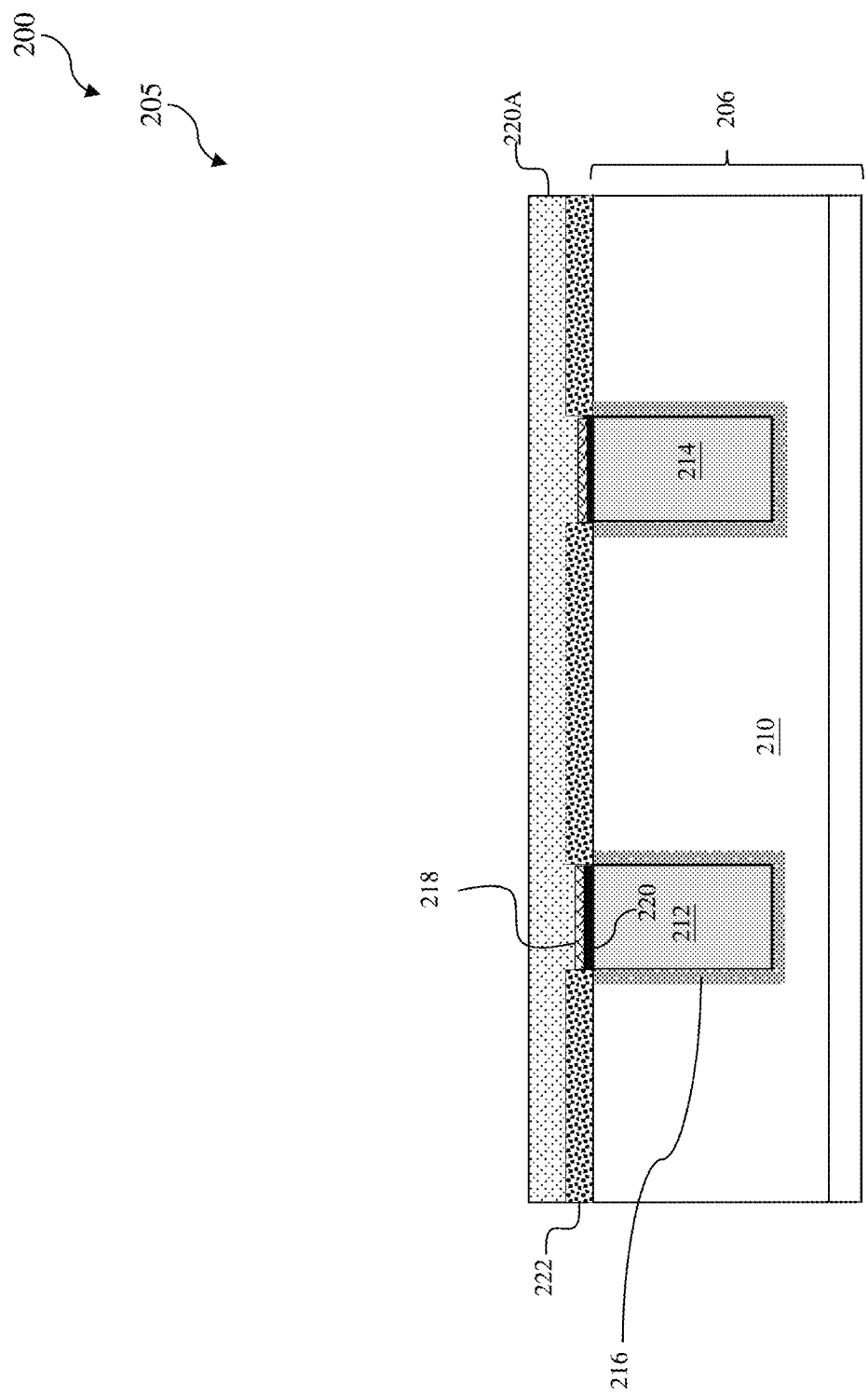

After the amorphous carbon layer 220A is formed, a carbon dissolution process is applied, as shown in block 306B of FIG. 5 and FIG. 6E. The amorphous carbon dissolution process may involve an annealing process 602. The annealing process 602 may apply a temperature within a range of about 200° C. to about 1200° C. The annealing process 602 may also apply a pressure within a range of about 0.25 torr to about 30 atm. The amorphous carbon dissolution process causes carbon atoms of the carbon layer 220A to migrate through the metal capping layer 218 and towards the conductive features 212 and 214. This migration results in the formation of the graphene layer 220 positioned between the conductive feature 212 and the metal capping layer 218, as well as between the conductive feature 214 and the metal capping layer 218 (FIG. 6F).

Figure 6G:
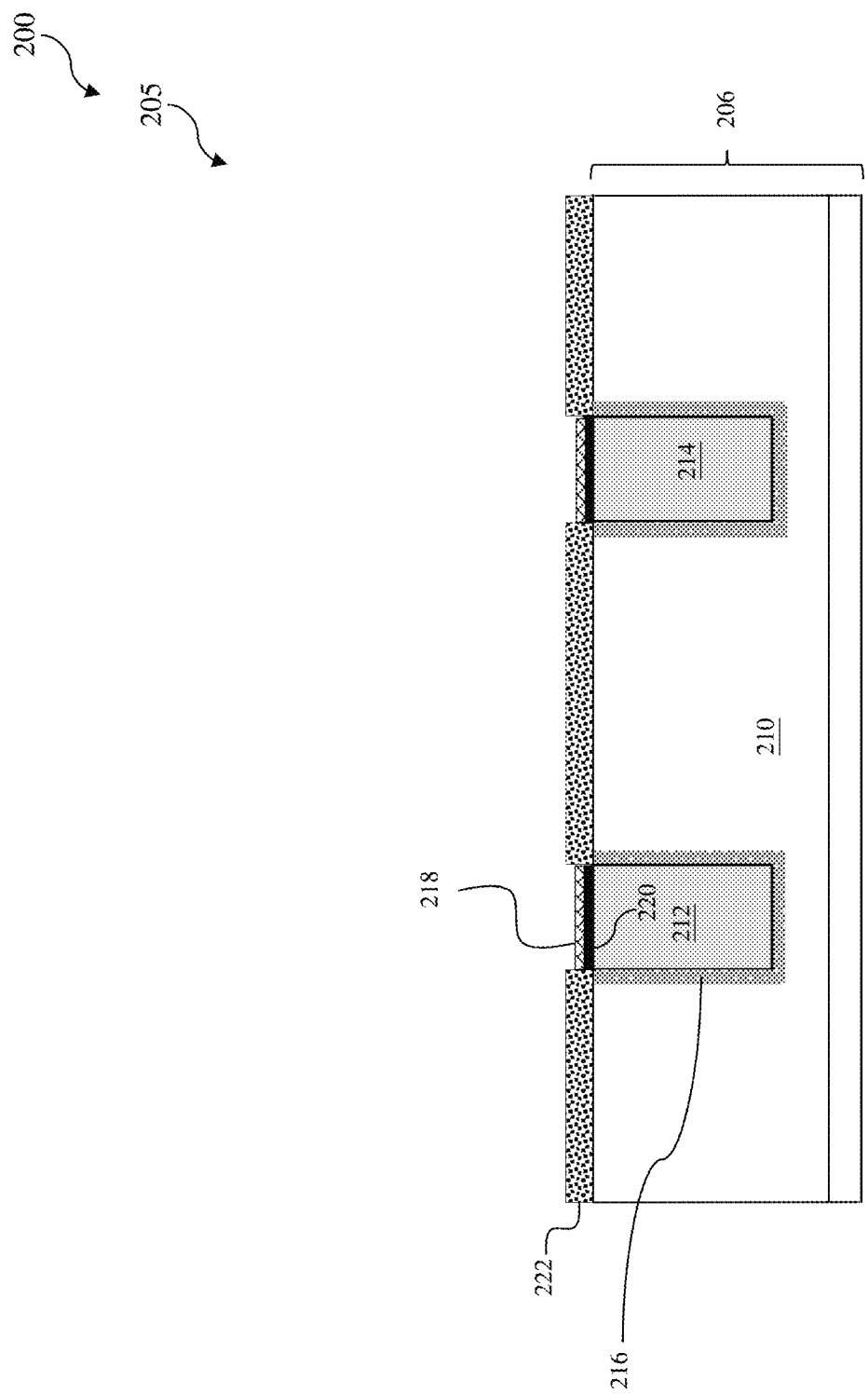
Figure 6H:
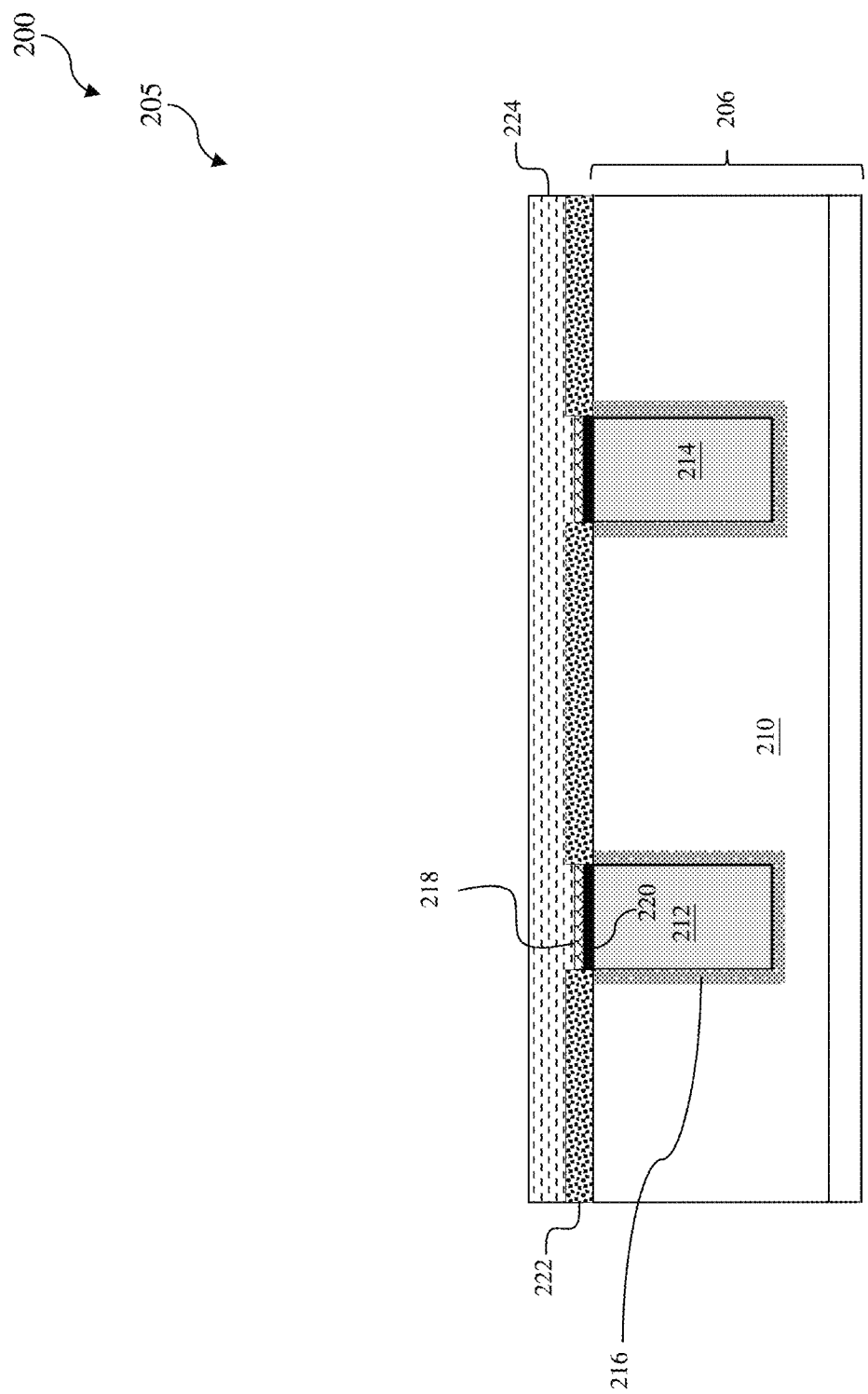
Figure 6I:
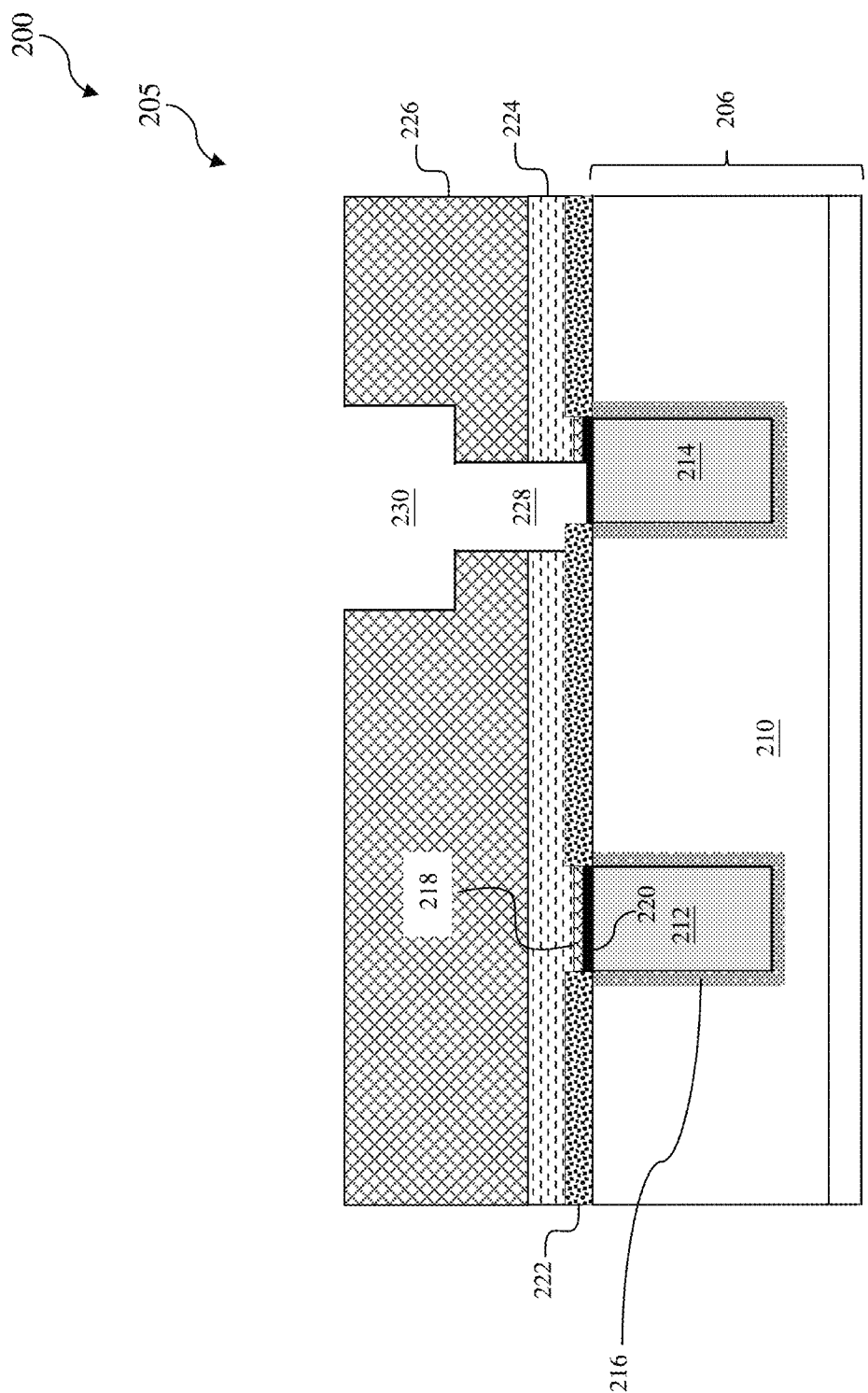

Turning to block 308B of FIG. 5 and FIG. 6G, after the graphene layer 220 is formed, the amorphous carbon layer 220A may be removed through a removal process. The removal process may be, for example, a selective etching process. A selective etching process may be designed to remove the amorphous carbon layer 220A without substantially affecting the metal capping layer 218 underneath. The selective etching process may be a wet etching process or a dry etching process, using one of the etching conditions already described above.

Figure 6J:
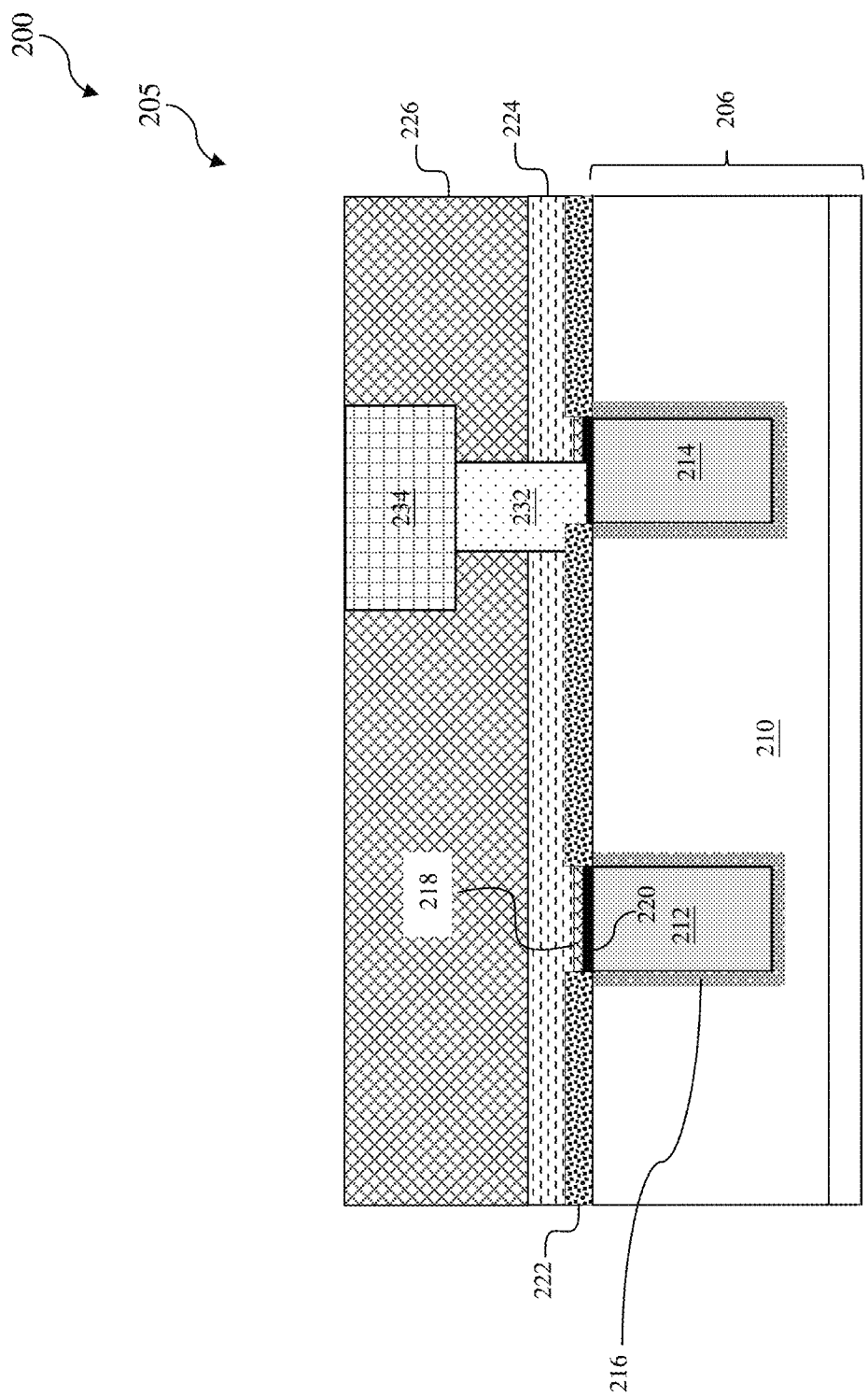

The method 100 proceeds through the remaining steps 114 and 116 (FIG. 1) via similar processes as described above to form the continuous ESL 224 (FIG. 6H), the dielectric layer 226 (FIG. 6I), the via hole 228 (FIG. 6I), the metal line trench 230 (FIG. 6I), the via feature 232 (FIG. 6J), and the metal line 234 (FIG. 6J). However, the semiconductor structure formed via the third embodiment differs from that formed via the previous embodiments in that the graphene layer 220 is formed beneath the selective metal capping layer 218. This is due to the different method employed to form the graphene layer 220. As can be seen in FIG. 6J, the graphene layer interposes between the via feature 232 and the conductive feature 214. As described above, graphene has high conductance and low resistance. In many embodiments, the presence of the graphene layer reduces the interfacial resistance between the via feature 232 and the conductive feature 214. Meanwhile, the selective metal capping layer 218 improves the electron migration property of the interface.

The semiconductor devices, 200, may include additional features, which may be formed by subsequent processing steps before, during, or after the method 100. For example, various additional vias/lines and multilayers interconnect features are formed over the substrate 206. The various interconnection features may implement various conductive materials including copper, tungsten, and/or silicide. In one example, a damascene and/or dual damascene process is used to form a copper related multilayer interconnection structure.

The present disclosure provides a novel method of forming graphene-assisted low-resistance interconnect structures that mitigates the risk of short-circuit formation in the case of via misalignment. For example, this disclosure provides forming a graphene layer over the conductive features, and a selective etch-stop layer in between the segments of the graphene layer to provide electric insulations. In one embodiment, the graphene layer is formed first, and used as a template in forming the selective etch-stop layer. In another embodiment, the etch-stop layer is formed before the graphene layer. In this scenario, a selective metal-capping layer, and/or a selective blocking layer is first formed over the conductive feature which serves as the template for forming the etch-stop layer. The graphene layer may be formed by a direct deposition method, such as ALD, CVD, PEALD, PECVD. Alternatively, the graphene layer may be formed by first forming a layer of amorphous carbon over the substrate, and subsequently converting the amorphous carbon into the graphene layer at a relatively high temperature.

There are several distinct physical characteristics associated with the semiconductor device 200 due to the unique fabrication process flow of the present disclosure. For example, the interconnect structure includes a plurality of conductive features embedded within a first dielectric feature. The interconnect structure may further include a layer of graphene over the conductive features. The layer of graphene may interpose between two conductive features. The interconnect structure may further include a selective etch-stop layer formed over the first dielectric layer and between the segments of the layer of graphene. The selective etch-stop layer may interface with a vertical surface of the layer of graphene. The selective etch-stop layer may include a top surface that extends over a top surface of the layer of graphene. There may be a continuous etch-stop layer that overlays the layer graphene over the conductive features and overlays the selective etch-stop layer elsewhere. There may be a second dielectric layer formed over the continuous etch-stop layer, such that a portion of the continuous etch-stop layer interposes between the selective etch-stop layer and the second dielectric layer. There may be a via and a metal line formed within the second dielectric layer. The via may extends through the continuous etch-stop layer but is stopped by the selective etch-stop layer. There may also be a selective metal capping layer formed over the conductive features. In some embodiments, the selective metal capping layer is between the conductive features and the graphene layers. In some other embodiments, the graphene layer is between the conductive features and the selective metal capping layer.

Based on the above discussions, it can be seen that the embodiments of the present disclosure offer advantages over conventional interconnect structures. It is understood, however, that no particular advantage is required, other embodiments may offer different advantages, and that not all advantages are necessarily disclosed herein. One advantage is the reduction of interface resistance when conductive features from different levels of an interconnect structure are misaligned. Another advantage is that proper insulation between neighboring conductive features, in either the same or the neighboring level of the interconnect structure, may be maintained even when misalignment occurs. Accordingly, the device reliability and performance are improved.

The present disclosure provides for many different embodiments. Semiconductor structures and methods of preparing the same are disclosed herein. One aspect of the present disclosure involves a semiconductor structure that comprises a first conductive feature embedded within a first dielectric layer, a via disposed over the first conductive feature, a second conductive feature disposed over the via, and a graphene layer disposed over at least a portion of the first conductive feature. The via electrically couples the first conductive feature to the second conductive feature. In some embodiments, at least a portion of the graphene layer interposes between the via and the first conductive feature. In some embodiments, the semiconductor structure further comprises a capping layer disposed over a portion of the first conductive feature and beneath the via. In some embodiments, the semiconductor structure further comprises a capping layer disposed over at least a portion of the graphene layer. In some embodiments, the semiconductor structure further comprises a third conductive feature embedded within the first dielectric layer, and a second dielectric layer. A top surface of the third conductive feature is substantially co-planar with a top surface of the first conductive feature. And the third conductive feature is separated from the first conductive feature by the second dielectric layer. In some embodiments, the semiconductor structure further comprises a third dielectric layer disposed over a portion of the first conductive feature and at least a portion of the third conductive feature. The second dielectric layer is disposed between the first dielectric layer and the third dielectric layer. In some embodiments, the third conductive feature is separated from the via by at least a portion of the second dielectric layer. In some embodiments, the semiconductor structure further comprises a fourth dielectric layer. At least a portion of the third dielectric layer interposes between a portion of the fourth dielectric layer and the second dielectric layer. And the second conductive feature and at least a portion of the via are embedded within the fourth dielectric layer.

Another aspect of the present disclosure involves a semiconductor structure that comprises a first conductive feature and a second conductive feature embedded within a first dielectric layer and separated by a portion of the first dielectric layer, a first graphene layer disposed over the first conductive feature, a second graphene layer disposed over at least a first portion of the second conductive feature, a second dielectric layer disposed over the portion of the first dielectric layer, and a third conductive feature disposed over a second portion of the second conductive feature. A bottom portion of the third conductive feature is horizontally separated from the first graphene layer by the second dielectric layer. In some embodiments, the semiconductor structure further comprises a third dielectric layer disposed over the first graphene layer, the second graphene layer, and the second dielectric layer. The bottom portion of the third conductive feature is at least partially surrounded by the third dielectric layer. In some embodiments, the first graphene layer and the second graphene layer are horizontally separated by at least a portion of the second dielectric layer. In some embodiments, a top surface of the second dielectric layer extends above a top surface of the first graphene layer. In some embodiments, at least a portion of the second graphene layer is disposed between the second conductive feature and the third conductive feature.

A further aspect of the present disclosure involves a method of manufacturing an integrated circuit (IC) device. A semiconductor substrate is provided. The semiconductor substrate has an interlayer dielectric (ILD) layer disposed thereon. A first conductive feature and a second conductive feature are formed within the ILD layer. A graphene layer is formed. A first portion of the graphene layer is formed over the first conductive feature, and a second portion of the graphene layer is formed over the second conductive feature. A dielectric layer is formed over portions of the ILD layer not covered by the graphene layer. And a via feature is formed over the first conductive feature. The via feature is separated from the second conductive feature by the dielectric layer. In some embodiments, the dielectric layer is a first dielectric layer. The forming of the via feature includes forming a second dielectric layer over the first dielectric layer and over the graphene layer and etching through the second dielectric layer to form a via hole, while leaving the first dielectric layer substantially unchanged. In some embodiments, the forming of the graphene layer includes forming an amorphous carbon layer over the first and the second conductive features; and conducting a thermal treatment of the amorphous carbon layer. In some embodiments, the forming of the dielectric layer includes forming the dielectric layer between the first portion of the graphene layer and the second portion of the graphene layer. The dielectric layer interfaces with a vertical surface of the graphene layer. In some embodiments, the forming of the dielectric layer includes forming a selective blocking layer having a first segment over the first conductive feature and a second segment over the second conductive feature; forming the dielectric layer between the first segment and the second segment; and removing the selective blocking layer. In some embodiments, a capping layer is formed over the first and the second conductive features. The amorphous carbon layer is formed over the capping layer. And the thermal treatment causes at least a portion of the amorphous carbon to migrate through the capping layer and to form the graphene layer. In some embodiments, the thermal treatment includes applying a temperature within a range of about 200° C. to about 1200° C. and applying a pressure within a range of about 0.25 torr to about 30 atm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first conductive feature disposed in a first dielectric layer;
   a second conductive feature disposed in the first dielectric layer and adjacent to the first conductive feature;
   a graphene layer disposed over the first and the second conductive features;
   a second dielectric layer disposed over the first dielectric layer, wherein sidewalls of the second dielectric layer directly contacts sidewalls of the graphene layer; and
   a via electrically coupled to the first conductive feature, wherein the via is misaligned with the first conductive feature such that a first side of the via directly contacts the second dielectric layer and a second side of the via is distanced away from the second dielectric layer by a portion of the graphene layer.

2. The semiconductor structure of claim 1, further comprising a metal capping layer disposed between the graphene layer and each of the first and the second conductive features.

3. The semiconductor structure of claim 1, further comprising a metal capping layer disposed over the graphene layer.

4. The semiconductor structure of claim 1, further comprising a third dielectric layer over the first conductive feature, the second conductive feature, and the second dielectric layer, wherein the via penetrates the third dielectric layer.

5. The semiconductor structure of claim 1, further comprising a fourth dielectric layer, wherein the via is disposed in the fourth dielectric layer.

6. The semiconductor structure of claim 5, further comprising a metal line landing on the via, the metal line disposed in the fourth dielectric layer.

7. The semiconductor structure of claim 1, wherein at least a portion of the graphene layer interposes between the via and the one of the first and the second conductive features.

8. The semiconductor structure of claim 1, wherein the via directly contacts the first conductive feature.

9. A semiconductor structure, comprising:
a first conductive feature and a second conductive feature disposed in an interlayer dielectric (ILD) layer;
a first graphene layer disposed over the first conductive feature;
a second graphene layer disposed over a portion of the second conductive feature;
an etch-stop layer (ESL) horizontally interposed between the first graphene layer and the second graphene layer, wherein a side surface of the first or the second graphene layer directly contacts a side surface of the ESL; and
a third conductive feature electrically coupled to the second conductive feature, wherein a first side surface of the third conductive feature is separated from the first graphene layer by a portion of the ESL,
wherein the first side surface of the third conductive feature directly contacts the ESL,
wherein a second side surface of the third conductive feature directly contacts a side surface of the second graphene layer.

10. The semiconductor structure of claim 9, wherein the ESL is a first ESL, the semiconductor structure further comprising a second ESL disposed over the first graphene layer, the second graphene layer, and the first ESL, and wherein a bottom portion of the third conductive feature is at least partially surrounded by the second ESL.

11. The semiconductor structure of claim 9, wherein a top surface of the ESL protrudes from a top surface of the first graphene layer and the second graphene layer.

12. The semiconductor structure of claim 9, wherein at least a portion of the second graphene layer is disposed between the second conductive feature and the third conductive feature.

13. The semiconductor structure of claim 9, wherein the third conductive feature also directly contacts a top surface of the ESL.

14. The semiconductor structure of claim 9, wherein the ESL is a selective ESL that does not cover top surfaces of the first and second graphene layers, further comprising a continuous ESL disposed over the selective ESL.

15. A method, comprising:
forming a first conductive feature and a second conductive feature in a first interlayer dielectric (ILD) layer;
selectively forming a graphene layer over top surfaces of the first and the second conductive features, wherein a top surface of the first ILD layer is free of the graphene layer;
selectively forming an etch-stop layer (ESL) over the top surface of the first ILD layer, wherein the top surfaces of the first and the second conductive features are free of the ESL;
forming a second ILD layer over the first ILD layer;
etching the second ILD layer to expose the first conductive feature in an opening, wherein the opening is formed between portions of the ESL; and
forming a third conductive feature in the opening.

16. The method of claim 15, further comprising, before selectively forming the graphene layer, selectively depositing a capping layer over the top surfaces of the first and the second conductive features but not over the first ILD layer.

17. The method of claim 16, wherein selectively forming the graphene layer includes:
selectively depositing an amorphous carbon layer over the capping layer; and
applying a thermal treatment to the amorphous carbon layer, wherein the thermal treatment causes at least a portion of the amorphous carbon layer to migrate through the capping layer and form the graphene layer.

18. The method of claim 16, wherein selectively forming the graphene layer includes directly depositing the graphene layer over the capping layer but not over the first ILD layer.

19. The method of claim 15, wherein selectively forming the graphene layer includes directly depositing the graphene layer to directly contact the top surfaces of the first and the second conductive features but not the first ILD layer.

20. The method of claim 15, wherein selectively forming of the ESL includes:
forming a selective blocking layer having a first segment over the first conductive feature and a second segment over the second conductive feature;
forming the ESL between the first segment and the second segment; and
selectively removing the selective blocking layer with respect to the ESL.

* * * * *